US009141750B2

(12) United States Patent
Yashima et al.

(10) Patent No.: US 9,141,750 B2
(45) Date of Patent: Sep. 22, 2015

(54) CHARGED PARTICLE BEAM WRITING APPARATUS AND IRRADIATION TIME APPORTIONMENT METHOD OF CHARGED PARTICLE BEAMS FOR MULTIPLE WRITING

(71) Applicant: NuFlare Technology, Inc., Numazu-shi (JP)

(72) Inventors: Jun Yashima, Kanagawa (JP); Akihito Anpo, Tokyo (JP); Yasuo Kato, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/932,392

(22) Filed: Jul. 1, 2013

(65) Prior Publication Data
US 2014/0017349 A1    Jan. 16, 2014

(30) Foreign Application Priority Data

Jul. 10, 2012  (JP) .................................. 2012-154457

(51) Int. Cl.
| G06F 17/50 | (2006.01) |
| H01J 37/317 | (2006.01) |
| H01J 37/302 | (2006.01) |
| B82Y 10/00 | (2011.01) |
| B82Y 40/00 | (2011.01) |

(52) U.S. Cl.
CPC .............. *G06F 17/5081* (2013.01); *B82Y 10/00* (2013.01); *B82Y 40/00* (2013.01); *H01J 37/3026* (2013.01); *H01J 37/3174* (2013.01); *H01J 2237/31764* (2013.01); *H01J 2237/31766* (2013.01)

(58) Field of Classification Search
CPC .............. H01J 37/3026; H01J 37/3174; H01J 2237/31764; H01J 2237/31766; G06F 17/5081
USPC ............................... 250/492.2, 492.3; 716/55
See application file for complete search history.

(56) References Cited

U.S. PATENT DOCUMENTS 5,703,376 A * 12/1997 Jensen ..................... 250/492.22
7,525,110 B2 * 4/2009 Suzuki et al. ............ 250/492.22
(Continued)

FOREIGN PATENT DOCUMENTS

JP          10-261557        9/1998

OTHER PUBLICATIONS

Combined Office Action and Search Report issued Sep. 3, 2014, in Taiwanese Patent Application No. 102120714 with English translation.

*Primary Examiner* — Jack Berman
*Assistant Examiner* — Wyatt Stoffa
(74) *Attorney, Agent, or Firm* — Oblon, McClelland, Maier & Neustadt, L.L.P.

(57) ABSTRACT

A beam writing apparatus includes a unit to obtain a specific value by calculating an integer by dividing a total irradiation time by a multiplied value of a region number and a repeating times number, and by multiplying the integer by the repeating times number, to add the repeating times number to the specific value when a region is in the multiple writing unit regions and is not a specific region and when a region number of the multiple writing unit region, defined excluding the specific region, is below or equal to a value obtained by dividing the total irradiation time by the multiplied value of the region number and the repeating times number, to obtain a first remainder, and dividing the first remainder by the repeating times number, and to treat an added value of the repeating times number and the specific value, as a total irradiation time.

20 Claims, 16 Drawing Sheets

(56) References Cited

U.S. PATENT DOCUMENTS

| | | | |
|---|---|---|---|
| 8,309,283 B2* | 11/2012 | Kato et al. | 430/30 |
| 2005/0221204 A1* | 10/2005 | Kimura | 430/5 |
| 2010/0072403 A1* | 3/2010 | Abe et al. | 250/492.22 |
| 2010/0173235 A1* | 7/2010 | Kato et al. | 430/30 |
| 2012/0036486 A1* | 2/2012 | Yashima et al. | 716/50 |
| 2012/0085940 A1* | 4/2012 | Matsumoto | 250/492.3 |
| 2012/0108063 A1* | 5/2012 | Emi et al. | 438/689 |

* cited by examiner

First Layer First Column | Second Layer First Column | First Layer Second Column | Second Layer Second Column Writing Time Apportionment Method(1)

| Layer | Repeat | | | | | | |
|---|---|---|---|---|---|---|---|
| X | 1 | 250 | 250 | 251 | 251 | 250 | 251 |
|   | 2 | 250 | 250 | 250 | 251 | 250 | 250 |
|   | 3 | 250 | 250 | 250 | 251 | 250 | 250 |
|   | 4 | 249 | 250 | 250 | 250 | 250 | 250 |
| 1 | 1 | 250 | 250 | 250 | 251 | 251 | 251 |
|   | 2 | 250 | 250 | 250 | 251 | 251 | 251 |
|   | 3 | 250 | 250 | 250 | 251 | 251 | 251 |
|   | 4 | 250 | 250 | 250 | 251 | 251 | 251 |
| 2 | 1 | 250 | 250 | 250 | 250 | 251 | 251 |
|   | 2 | 250 | 250 | 250 | 250 | 251 | 251 |
|   | 3 | 250 | 250 | 250 | 250 | 251 | 251 |
|   | 4 | 250 | 250 | 250 | 250 | 251 | 251 |
| 3 | 1 | 250 | 250 | 250 | 250 | 250 | 250 |
|   | 2 | 250 | 250 | 250 | 250 | 250 | 250 |
|   | 3 | 250 | 250 | 250 | 250 | 250 | 250 |
|   | 4 | 250 | 250 | 250 | 250 | 250 | 250 |
| Total | | 3999 | 4000 | 4001 | 4007 | 4008 | 4009 |

FIG. 6

Writing Time Apportionment Method(tShot)

| Layer | Repeat | | | | | |
|---|---|---|---|---|---|---|
| 1 | 1 | 264 | 250 | 251 | | n/Writing Times + Remainder |
| | 2 | 249 | 250 | 250 | | n/Writing Times |
| | 3 | 249 | 250 | 250 | | n/Writing Times |
| | 4 | 249 | 250 | 250 | | n/Writing Times |
| 2 | 1 | 249 | 250 | 250 | | n/Writing Times |
| | 2 | 249 | 250 | 250 | | n/Writing Times |
| | 3 | 249 | 250 | 250 | | n/Writing Times |
| | 4 | 249 | 250 | 250 | | n/Writing Times |
| 3 | 1 | 249 | 250 | 250 | | n/Writing Times |
| | 2 | 249 | 250 | 250 | | n/Writing Times |
| | 3 | 249 | 250 | 250 | | n/Writing Times |
| | 4 | 249 | 250 | 250 | | n/Writing Times |
| 4 | 1 | 249 | 250 | 250 | | n/Writing Times |
| | 2 | 249 | 250 | 250 | | n/Writing Times |
| | 3 | 249 | 250 | 250 | | n/Writing Times |
| | 4 | 249 | 250 | 250 | | n/Writing Times |
| Total | | 3999 | 4000 | 4001 | | n |

FIG. 7

Writing Time Apportionment Method (iShot)

| Writing ID | Layer | Repeat | | | | | |
|---|---|---|---|---|---|---|---|
| 1 | 1 | 1 | 250 | 250 | 251 | | n/Writing Times(+1 if Writing ID <= Remainder) |
| 2 | | 2 | 250 | 250 | 250 | | n/Writing Times(+1 if Writing ID <= Remainder) |
| 3 | | 3 | 250 | 250 | 250 | | n/Writing Times(+1 if Writing ID <= Remainder) |
| 4 | | 4 | 250 | 250 | 250 | | n/Writing Times(+1 if Writing ID <= Remainder) |
| 5 | 2 | 1 | 250 | 250 | 250 | | n/Writing Times(+1 if Writing ID <= Remainder) |
| 6 | | 2 | 250 | 250 | 250 | | n/Writing Times(+1 if Writing ID <= Remainder) |
| 7 | | 3 | 250 | 250 | 250 | ... | n/Writing Times(+1 if Writing ID <= Remainder) |
| 8 | | 4 | 250 | 250 | 250 | | n/Writing Times(+1 if Writing ID <= Remainder) |
| 9 | 3 | 1 | 250 | 250 | 250 | | n/Writing Times(+1 if Writing ID <= Remainder) |
| 10 | | 2 | 250 | 250 | 250 | | n/Writing Times(+1 if Writing ID <= Remainder) |
| 11 | | 3 | 250 | 250 | 250 | | n/Writing Times(+1 if Writing ID <= Remainder) |
| 12 | | 4 | 250 | 250 | 250 | | n/Writing Times(+1 if Writing ID <= Remainder) |
| 13 | 4 | 1 | 250 | 250 | 250 | | n/Writing Times(+1 if Writing ID <= Remainder) |
| 14 | | 2 | 250 | 250 | 250 | | n/Writing Times(+1 if Writing ID <= Remainder) |
| 15 | | 3 | 250 | 250 | 250 | | n/Writing Times(+1 if Writing ID <= Remainder) |
| 16 | | 4 | 249 | 250 | 250 | | n/Writing Times(+1 if Writing ID <= Remainder) |
| | Total | | 3999 | 4000 | 4001 | | n |

FIG. 8

Writing Time Appotionment Method (2)

| Layer | Repeat | | | | | | |
|---|---|---|---|---|---|---|---|
| X | 1 | 252 | 250 | 251 | 253 | 250 | 251 |
| | 2 | 249 | 250 | 250 | 250 | 250 | 250 |
| | 3 | 249 | 250 | 250 | 250 | 250 | 250 |
| | 4 | 249 | 250 | 250 | 250 | 250 | 250 |
| 1 | 1 | 250 | 250 | 250 | 251 | 251 | 251 |
| | 2 | 250 | 250 | 250 | 251 | 251 | 251 |
| | 3 | 250 | 250 | 250 | 251 | 251 | 251 |
| | 4 | 250 | 250 | 250 | 251 | 251 | 251 |
| 2 | 1 | 250 | 250 | 250 | 250 | 251 | 251 |
| | 2 | 250 | 250 | 250 | 250 | 251 | 251 |
| | 3 | 250 | 250 | 250 | 250 | 251 | 251 |
| | 4 | 250 | 250 | 250 | 250 | 251 | 251 |
| 3 | 1 | 250 | 250 | 250 | 250 | 250 | 250 |
| | 2 | 250 | 250 | 250 | 250 | 250 | 250 |
| | 3 | 250 | 250 | 250 | 250 | 250 | 250 |
| | 4 | 250 | 250 | 250 | 250 | 250 | 250 |
| Total | | 3999 | 4000 | 4001 | 4007 | 4008 | 4009 |

FIG. 12

Writing Time Apportionment Method(3)

| Layer | Repeat | | | | | | |
|---|---|---|---|---|---|---|---|
| X | 1 | 249 | 250 | 251 | 250 | 250 | 251 |
| | 2 | 250 | 250 | 250 | 251 | 250 | 250 |
| | 3 | 250 | 250 | 250 | 251 | 250 | 250 |
| | 4 | 250 | 250 | 250 | 251 | 250 | 250 |
| 1 | 1 | 250 | 250 | 250 | 251 | 251 | 251 |
| | 2 | 250 | 250 | 250 | 251 | 251 | 251 |
| | 3 | 250 | 250 | 250 | 251 | 251 | 251 |
| | 4 | 250 | 250 | 250 | 251 | 251 | 251 |
| 2 | 1 | 250 | 250 | 250 | 250 | 251 | 251 |
| | 2 | 250 | 250 | 250 | 250 | 251 | 251 |
| | 3 | 250 | 250 | 250 | 250 | 251 | 251 |
| | 4 | 250 | 250 | 250 | 250 | 251 | 251 |
| 3 | 1 | 250 | 250 | 250 | 250 | 250 | 250 |
| | 2 | 250 | 250 | 250 | 250 | 250 | 250 |
| | 3 | 250 | 250 | 250 | 250 | 250 | 250 |
| | 4 | 250 | 250 | 250 | 250 | 250 | 250 |
| Total | | 3999 | 4000 | 4001 | 4007 | 4008 | 4009 |

FIG. 15

CHARGED PARTICLE BEAM WRITING APPARATUS AND IRRADIATION TIME APPORTIONMENT METHOD OF CHARGED PARTICLE BEAMS FOR MULTIPLE WRITING

CROSS-REFERENCE TO RELATED APPLICATION

This application is based upon and claims the benefit of priority from the prior Japanese Patent Application No. 2012-154457 filed on Jul. 10, 2012 in Japan, the entire contents of which are incorporated herein by reference.

BACKGROUND OF THE INVENTION

1. Field of the Invention

The present invention relates to a charged particle beam writing apparatus, and an apportionment method of irradiation time of charged particle beams for multiple writing, and for example, to an apparatus and method for calculating the irradiation time of each beam in multiple writing.

2. Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. For forming a desired circuit pattern on such semiconductor devices, a master or "original" pattern (also called a mask or a reticle) of high accuracy is needed. Thus, the electron beam (EB) writing technique, which intrinsically has excellent resolution, is used for producing such a highly precise master pattern.

FIG. 16 is a schematic diagram explaining operations of a variable shaped electron beam writing or "drawing" apparatus. As shown in the figure, the variable shaped electron beam writing apparatus operates as described below. A first aperture plate 410 has a quadrangular opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 420, and thereby to irradiate a target object or "sample" 340 placed on a stage which continuously moves in one predetermined direction (e.g., the x direction) during the writing. In other words, a quadrangular shape that can pass through both the opening 411 and the variable-shape opening 421 is used for pattern writing in a writing region of the target object 340 on the stage continuously moving in the x direction. This method of forming a given shape by letting beams pass through both the opening 411 of the first aperture plate 410 and the variable-shape opening 421 of the second aperture plate 420 is referred to as a variable shaped beam (VSB) method.

In the electron beam writing apparatus, when performing multiple writing, a shot time (irradiation time) per shot is calculated by dividing a total beam irradiation time (total writing time) of a plurality of times of shooting the same position by the multiplicity. Conventionally, the method of adding an entire remainder (fraction) obtained by dividing the total beam irradiation time (the total writing time) by the multiplicity to one shot has been employed. On the other hand, as the generation of the writing apparatus advances, the multiplicity tends to increase, which causes a problem in that there is a divergence (imbalanced nature) between the irradiation time of a shot to which the remainder was added and the irradiation time of each of other shots.

As other technique relevant to the shot time of each shot, the following is disclosed: Specifically, when a basis dose based on which a pattern is formed is defined to be $D_s$, the first time writing and the second time writing are performed each using a dose $D_s/4$ without correcting the dose, and the third time writing and the fourth time writing are performed in corrected state based on a correction dose $D_c$, using a dose $(D_c-D_s)/2+D_s/4$ (refer to, e.g., Japanese Patent Application Laid-open (JP-A) No. 10-261557).

As described above, a problem exists in that there is a divergence (imbalanced nature) between the irradiation time of a shot to which the remainder was added and the irradiation time of each of other shots. For example, when the irradiation time is defined according to a gray level value, the irradiation time of the shot to which the remainder described above was added is longer than the irradiation time of each of other shots by up to (multiplicity−1 gray level). For example, when the multiplicity can be set up to 1024, a remainder of up to 1023 gray levels may be generated. For example, when a pattern whose total irradiation time is 2047 gray levels is written by the multiplicity of 1024, there is a possibility of a case in which a specific number-th writing is performed by an irradiation time of 1024 gray levels, and writing of each of other 1023 times is performed by the irradiation time of 1 gray level. This causes a problem of degradation of writing precision due to heat, for example. Even if the same irradiation dose is used, the formed dimension is thicker when irradiation is performed at a time compared with the case of irradiation performed separately. Therefore, a problem occurs in that if a large dose difference is generated between each time of multiple writing, impermissible influence is given to the formed dimension. Moreover, for example, in the case of simultaneous radiation of a plurality of beams (for example, a case of multiple beam writing), since a following shot cannot be executed until a shot of the longest irradiation time has been completed, a problem of lowering the writing processing speed is generated. Furthermore, in the case of multiple writing, since writing is performed while shifting the position of a writing unit region, such as a stripe region and a sub field region, and further, since, in each writing unit region, multiple writing is repeatedly performed without shifting the position, it is desirable not to make a divergence of total irradiation time between writing unit regions as much as possible for suppressing the imbalanced nature of irradiation time between shots.

BRIEF SUMMARY OF THE INVENTION

In accordance with one aspect of the present invention, a charged particle beam writing apparatus includes:

a sum total irradiation time calculation unit configured to obtain a specific value by calculating an integer value by dividing a total irradiation time "n" of charged particle beams of a plurality of times of shooting a same position by a multiplied value, which is obtained by multiplying a multiple writing unit region number "m" being a number of a plurality of multiple writing unit regions for performing multiple writing while shifting a position by a repeating times number "r" being a number of repeating times of performing multiple writing without shifting a position in each of the plurality of multiple writing unit regions, and by multiplying the integer value by the repeating times number "r", to add the repeating times number "r" to the specific value when a multiple writing unit region is in the plurality of multiple writing unit regions and is not a specific multiple writing unit region previously set in the plurality of multiple writing unit regions and when a multiple writing unit region number of the multiple writing unit region, defined excluding the specific multiple writing unit region, is less than or equal to a value that is obtained by dividing the total irradiation time "n" by the multiplied value, which is calculated by multiplying the multiple writing unit region number "m" by the repeating times number "r", so as to obtain a first remainder, and further dividing the first remainder by the repeating times number "r", and to treat an added value of "r" and the specific value, as a total irradiation time of a charged particle beam in the multiple writing unit region, in the charged particle beams of the plurality of times of shooting the same position, to treat the specific value, as the total irradiation time of the charged particle beam in the multiple writing unit region, in the charged particle beams of the plurality of times of shooting the same position, when the multiple writing unit region is in the plurality of multiple writing unit regions and is not the specific multiple writing unit region previously set in the plurality of multiple writing unit regions and when the multiple writing unit region number of the multiple writing unit region, defined excluding the specific multiple writing unit region, is not less than or equal to the value that is obtained by dividing the first remainder by the repeating times number "r", and to add a second remainder to the specific value when the multiple writing unit region is the specific multiple writing unit region previously set in the plurality of multiple writing unit regions, where the second remainder is obtained by dividing the total irradiation time "n" by the repeating times number "r", and to treat an added value of the second remainder and the specific value, as the total irradiation time of the charged particle beam in the multiple writing unit region, in the charged particle beams of the plurality of times of shooting the same position; and a writing unit configured to write a pattern on a target object by irradiating the target object with the charged particle beams to be the total irradiation time corresponding to each of the plurality of multiple writing unit regions.

In accordance with another aspect of the present invention, an irradiation time apportionment method of charged particle beams for multiple writing includes:

calculating a value, which is to be output, by obtaining an integer value by dividing a total irradiation time "n" by a multiplied value, which is obtained by multiplying a multiple writing unit region number "m" by a repeating times number "r", by multiplying the integer value by the repeating times number "r", and by adding the repeating times number "r" to a multiplied integer value, and treating the value as a sum total irradiation time of a charged particle beam in a multiple writing unit region concerned, in charged particle beams of a plurality of times of shooting a same position, when the multiple writing unit region concerned is in a plurality of multiple writing unit regions for performing multiple writing while shifting a position and is not a specific multiple writing unit region previously set in the plurality of multiple writing unit regions, and when a multiple writing unit region number of the multiple writing unit region concerned, defined excluding the specific multiple writing unit region, is less than or equal to a value that is obtained by dividing the total irradiation time "n" of the charged particle beams of the plurality of times of shooting the same position by the multiplied value, which is calculated by multiplying the multiple writing unit region number "m" being a number of a plurality of multiple writing unit regions by a repeating times number "r" being a number of repeating times of performing multiple writing without shifting a position in each of the plurality of multiple writing unit regions, so as to obtain a first remainder, and further dividing the first remainder by the repeating times number "r";

calculating a value, which is to be output, by obtaining the integer value by dividing the total irradiation time "n" by the multiplied value, which is obtained by multiplying the multiple writing unit region number "m" by the repeating times number "r", and by multiplying the integer value by the repeating times number "r", and treating the value as the sum total irradiation time of the charged particle beam in the multiple writing unit region concerned, in the charged particle beams of the plurality of times of shooting the same position, when the multiple writing unit region concerned is in the plurality of multiple writing unit regions and is not the specific multiple writing unit region previously set in the plurality of multiple writing unit regions, and when the multiple writing unit region number of the multiple writing unit region concerned, defined excluding the specific multiple writing unit region, is not less than or equal to a value obtained by dividing the first remainder by the repeating times number "r"; and calculating a value, which is to be output, by obtaining the integer value by dividing the total irradiation time "n" by the multiplied value, which is obtained by multiplying the multiple writing unit region number "m" by the repeating times number "r", by multiplying the integer value by the repeating times number "r", and by adding a second remainder of dividing the total irradiation time "n" by the repeating times number "r" to a multiplied integer value, and treating the value as the sum total irradiation time of the charged particle beam in the multiple writing unit region concerned, in the charged particle beams of the plurality of times of shooting the same position when the multiple writing unit region concerned is the specific multiple writing unit region previously set in the plurality of multiple writing unit regions.

BRIEF DESCRIPTION OF THE DRAWINGS

FIG. 6 shows an example of irradiation time apportioned by a writing time (irradiation time) apportionment method according to the first embodiment;

FIG. 7 shows an example of irradiation time apportioned by a writing time (irradiation time) apportionment method according to a comparative example against the first embodiment;

FIG. 8 shows an example of irradiation time apportioned by a writing time (irradiation time) apportionment method according to another comparative example against the first embodiment;

FIG. 12 shows an example of irradiation time apportioned by a writing time (irradiation time) apportionment method according to the second embodiment;

FIG. 15 shows an example of irradiation time apportioned by a writing time (irradiation time) apportionment method according to the third embodiment.

DETAILED DESCRIPTION OF THE INVENTION

In the following Embodiments, there will be described an apparatus and method capable of suppressing an imbalanced nature of irradiation time between shots.

Moreover, in the following Embodiments, there will be described a structure in which an electron beam is used as an example of a charged particle beam. The charged particle beam is not limited to the electron beam, and other charged particle beam, such as an ion beam, may also be used. Moreover, a variable-shaped electron beam writing apparatus will be described as an example of a charged particle beam apparatus.

Embodiment 1

Figure 1:
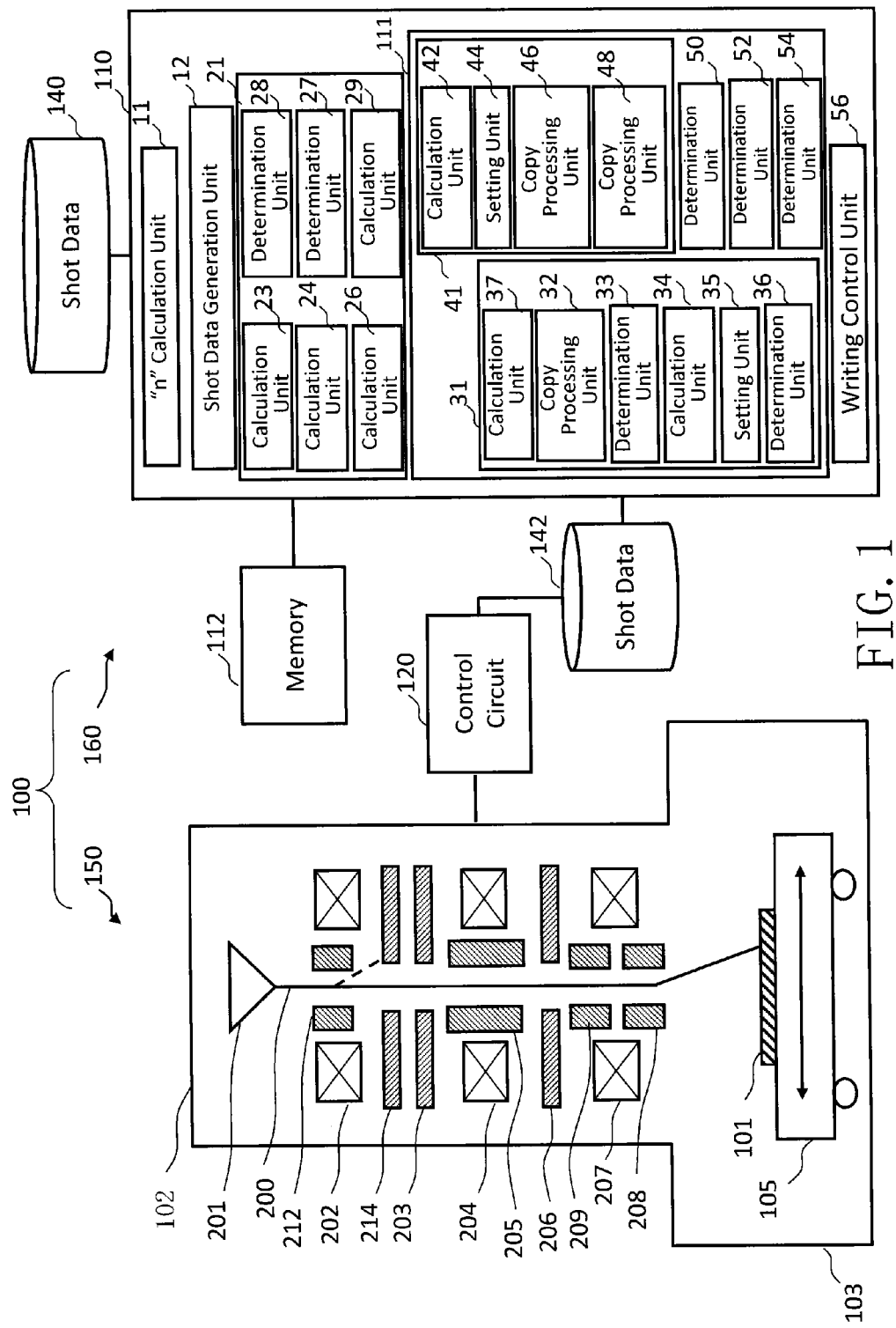
FIG. 1 is a schematic diagram showing a configuration of a writing apparatus according to the first embodiment.

FIG. 1 is a schematic diagram showing a configuration of a writing apparatus according to the first embodiment. In FIG. 1, a writing apparatus 100 includes a writing unit 150 and a control unit 160. The writing apparatus 100 is an example of a charged particle beam writing apparatus, and especially, an example of a variable-shaped electron beam (VSB) writing apparatus. The writing unit 150 includes an electron lens barrel 102 and a writing chamber 103. In the electron lens barrel 102, there are arranged an electron gun assembly 201, a blanking deflector (blanker) 212, a blanking aperture 214, an illumination lens 202, a first shaping aperture 203, a projection lens 204, a deflector 205, a second shaping aperture 206, an objective lens 207, a main deflector 208, and a sub deflector 209. In the writing chamber 103, there is arranged an XY stage 105 that is movable at least in the x and y directions. On the XY stage 105, there is placed a target object 101 (substrate) serving as a writing target to which resist is applied. The target object 101 is, for example, a mask for exposure, a silicon wafer, etc. used for manufacturing semiconductor devices. The mask is, for example, a mask blank on which a pattern has not yet been formed.

The control unit 160 includes a control computer unit 110, a control circuit 120, and storage devices 140 and 142, such as a magnetic disk drive. The control computer unit 110, the control circuit 120, and the storage devices 140 and 142 are mutually connected through a bus (not shown).

In the control computer unit 110, there are arranged a total irradiation time "n" calculation unit 11, a shot data generation unit 12, a sum total irradiation time calculation unit 21, a shot irradiation time calculation unit 111, and a writing control unit 56. Each function such as the total irradiation time "n" calculation unit 11, the shot data generation unit 12, the sum total irradiation time calculation unit 21, the shot irradiation time calculation unit 111, and the writing control unit 56 may be configured by software such as a program causing a computer to implement these functions or by hardware such as an electronic circuit. Alternatively, it may be configured by a combination of software and hardware.

In the sum total irradiation time calculation unit 21, there are arranged calculation units 23, 24, 26, and 29 and determination units 27 and 28. Each function such as the calculation units 23, 24, 26, and 29 and the determination units 27 and 28 may be configured by software such as a program causing a computer to implement these functions or by hardware such as an electronic circuit. Alternatively, it may be configured by a combination of software and hardware.

In the shot irradiation time calculation unit 111, there are arranged a specific layer irradiation time calculation unit 31, a non-specific layer irradiation time calculation unit 41, and determination units 50, 52, and 54. Each function such as the specific layer irradiation time calculation unit 31, the non-specific layer irradiation time calculation unit 41, and the determination units 50, 52, and 54 may be configured by software such as a program causing a computer to implement these functions or by hardware such as an electronic circuit. Alternatively, it may be configured by a combination of software and hardware.

In the specific layer irradiation time calculation unit 31, there are arranged calculation units 37 and 34, a copy processing unit 32, determination units 33 and 36, and a setting unit 35. Each function such as the calculation units 37 and 34, the copy processing unit 32, the determination units 33 and 36, and the setting unit 35 may be configured by software such as a program causing a computer to implement these functions or by hardware such as an electronic circuit. Alternatively, it may be configured by a combination of software and hardware.

In the non-specific layer irradiation time calculation unit 41, there are arranged a calculation unit 42, a setting unit 44, and copy processing units 46 and 48. Each function such as the calculation unit 42, the setting unit 44, and the copy processing units 46 and 48 may be configured by software such as a program causing a computer to implement these functions or by hardware such as an electronic circuit. Alternatively, it may be configured by a combination of software and hardware.

Input data necessary in the control computer unit 110 or a calculated result is stored in the memory 112 each time.

Pattern data (writing data) was input from the outside, and has been stored in the storage device 140.

FIG. 1 shows a structure necessary for explaining the first embodiment. Other structure elements generally necessary for the writing apparatus 100 may also be included.

Figure 2:
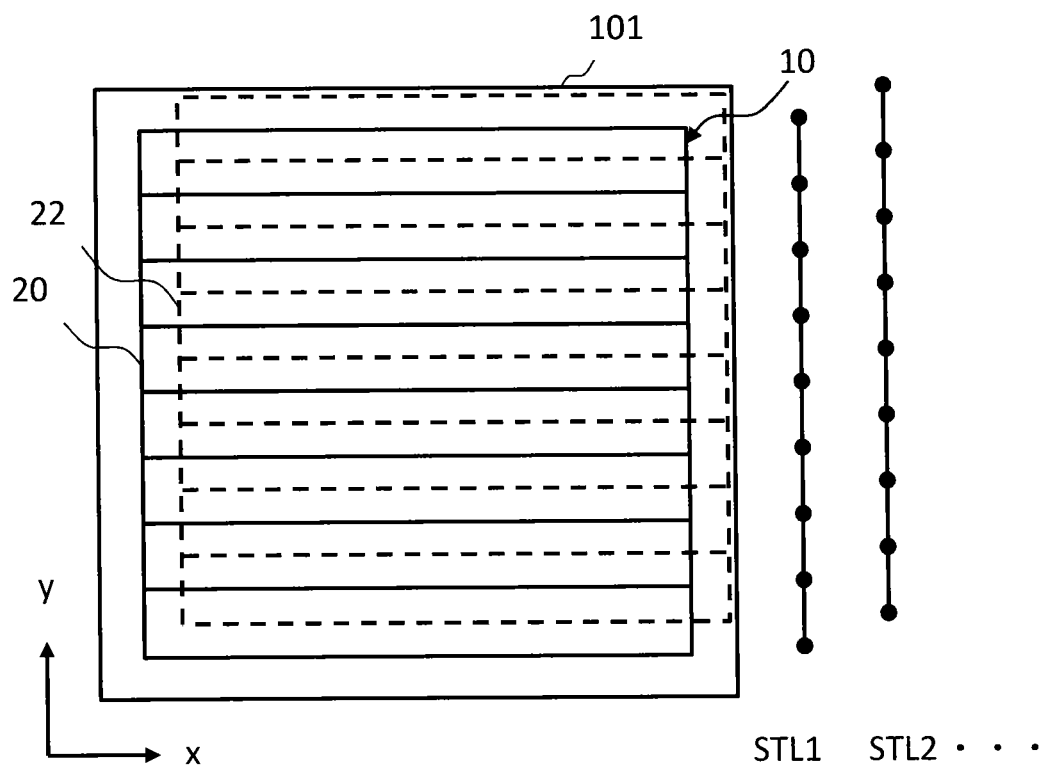
FIG. 2 is a schematic diagram explaining a writing procedure according to the first embodiment.

FIG. 2 is a schematic diagram explaining a writing procedure according to the first embodiment. In the writing apparatus 100, the writing region of the target object 101 is virtually divided into a plurality of strip-shaped stripe regions 20. FIG. 2 shows the case where one chip is written in the writing region 10 of the target object 101, for example. Needless to say, a plurality of chips may be written in the writing region 10 of the target object 101. Dividing is performed such that the width of the stripe region 20 is to be a width a little smaller than a width deflectable by the main deflector 208. Furthermore, when performing multiple writing in this stripe region unit (an example of a multiple writing unit region), the writing region 10 is virtually divided into a plurality of strip-shaped stripe regions 22, which is performed by shifting the position. It is preferable to set the stripe region 22 by shifting in the x and y directions by ½ of the width of the stripe region 20, for example. In such a case, in multiple writing, a plurality of stripe regions 20 are set as the first stripe layer (STL1) and a plurality of stripe regions 22 are set as the second stripe layer (STL2). FIG. 2 shows the case of two stripe layers, that is multiplicity is two in the stripe region, for example. However, it is not limited thereto. It is also acceptable to set the multiplicity in the stripe region to be three or more. For example, if the multiplicity in the stripe region is set to be α, it is preferable that the stripe region 22 is set by shifting in the x and y directions (or at least in the y direction) by 1/α the width of the stripe region 20, for example.

When performing writing onto the target object 101, the XY stage 105 is continuously moved in the x direction, for example. Thus, during the continuous movement, the electron beam 200 irradiates one stripe region 20. The XY stage 105 is continuously moved in the x direction, for example, and simultaneously, the shot position of the electron beam 200 is made to follow up the stage movement by the main deflector 208. It is possible to shorten the writing time by making a continuous movement. Moreover, it is further preferable to reduce the writing time by making the XY stage 105 move in a variable speed, such as a relatively low writable speed in a high pattern density region and a relatively high writable speed in a low pattern density region. After writing one stripe region 20 of the first layer (STL 1), the XY stage 105 is moved in the y direction by step feeding, and then writing operation is performed in the x direction (e.g., reverse direction, this time) for the stripe region 22 concerned of the second layer (STL 2). After writing the stripe region 22, the XY stage 105 is moved in the y direction by step feeding, and then writing operation is performed in the x direction (e.g., reverse direction, this time) for the next stripe region 20 of the first layer (STL 1). After writing the stripe region 20, the XY stage 105 is moved in the y direction by step feeding, and then writing operation is performed in the x direction (e.g., reverse direction, this time) for the stripe region 22 concerned of the second layer (STL 2). These operations are performed one by one. By performing the writing operation in a zigzag manner respectively for each stripe region 20 and each stripe region 22, the movement time of the XY stage 105 can be shortened. Alternatively, it is also preferable to perform the writing operation of each stripe region 20 and each stripe region 22 in the same direction (for example, the positive direction of the x direction).

Figure 3:
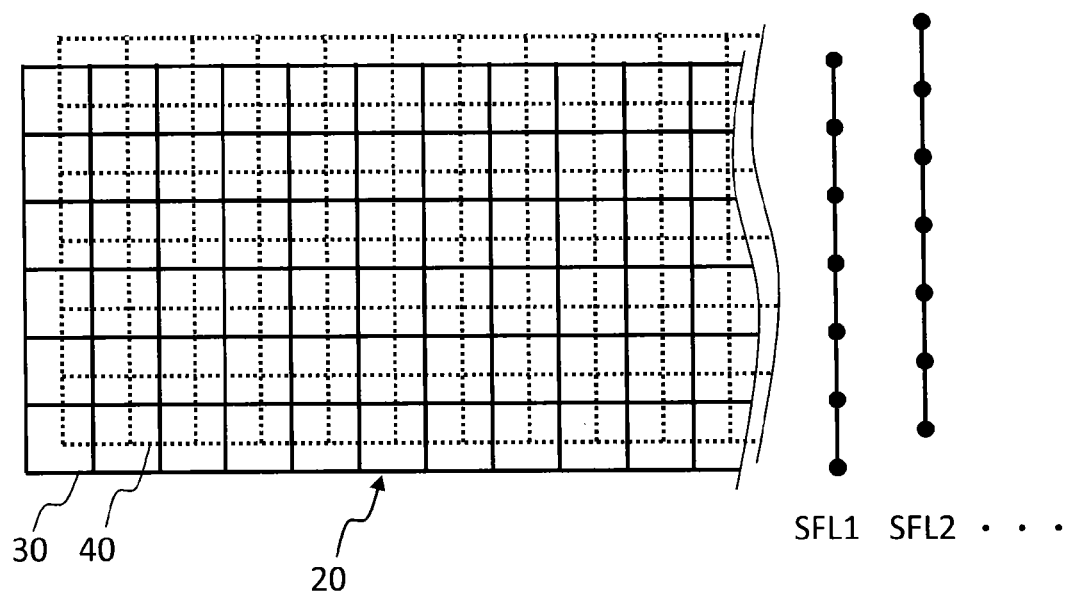
FIG. 3 is a schematic diagram explaining an SF layer according to the first embodiment.

FIG. 3 is a schematic diagram explaining an SF layer according to the first embodiment. When writing each stripe region 20, each stripe region 20 is virtually divided into a plurality of mesh-like subfield (SF) regions 30, and the writing is performed for each SF. Dividing is performed such that the width of the SF region 30 is to be a width a little smaller than a width deflectable by the sub-deflector 209. The SF region is a minimum deflection region in the regions written by the writing apparatus 100 of two stage deflection. Furthermore, when performing multiple writing per SF region unit (an example of a multiple writing unit region), the stripe region 20 is virtually divided into a plurality of mesh-like SF regions 40 by shifting the position. For example, it is preferable that the SF region 40 is set by performing shifting in the x and y directions by ½ of the width of the SF region 30. In that case, in multiple writing, a plurality of SF regions 30 are set as the first SF layer (SFL 1) and a plurality of SF regions 40 are set as the second SF layer (SFL 2). As to each stripe region 22, virtual dividing is performed in the similar way into a plurality of mesh-like SF regions 30 and 40, and writing is performed for each SF. FIG. 3 shows the case of two SF layers, that is multiplicity is two in the SF region, for example. However, it is not limited thereto. It is also acceptable to set the multiplicity in the SF region to be three or more. For example, if the multiplicity in the SF region is set to be β, it is preferable that the SF region 40 is set by shifting in the x and y directions (or at least in the y direction) by 1/β the width of the SF region 30, for example.

Figures 4A, 4B, 4C, 4D:
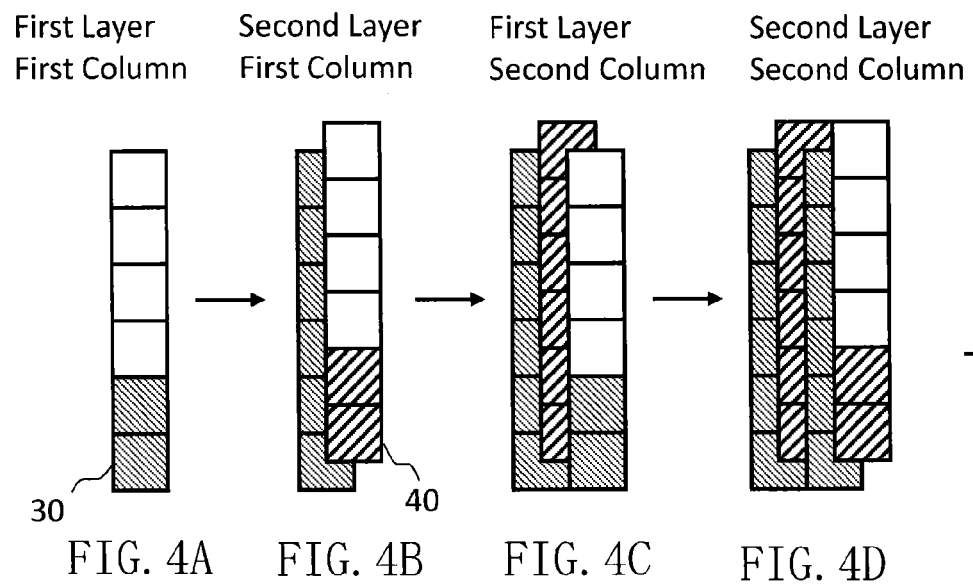
FIGS. 4A to 4E show examples of a writing order according to the first embodiment.
Figure 4E:
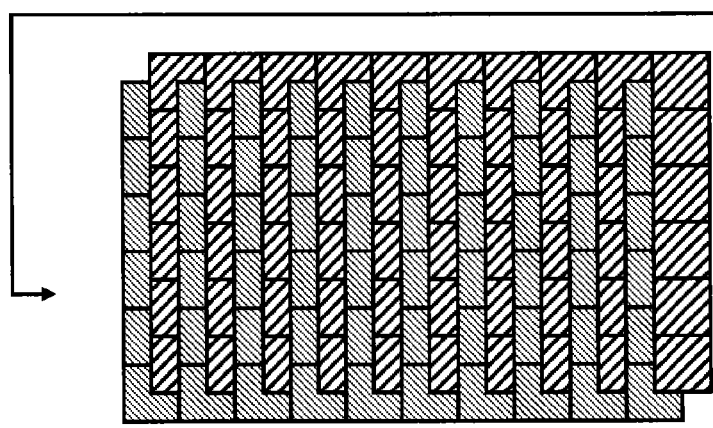

FIGS. 4A to 4E show examples of a writing order according to the first embodiment. In the example of FIGS. 4A to 4E, with respect to each stripe, the writing operation is controlled such that writing of the first SF layer and writing of the second SF layer are alternately repeated per SF region group composed of a plurality of SF regions arranged in the direction (y direction) perpendicular to the moving direction (x direction) of the XY stage 105. According to the controlling as shown in FIG. 4A, first, with respect to the first column of the first SF layer, writing is performed starting from the lower left SF region 30 in the y direction in order. After the entire first column of the first SF layer in the target stripe region 20 has been written, next, with respect to the first column of the second SF layer as shown in FIG. 4B, writing is performed starting from the lower left SF region 40 in the y direction in order. Then, after the entire first column of the second SF layer in the target stripe region 20 has been written, next, with respect to the second column of the first SF layer as shown in FIG. 4C, writing is performed starting from the lower left SF region 30 in the y direction in order. After the entire second column of the first SF layer in the target stripe region 20 has been written, next, with respect to the second column of the second SF layer as shown in FIG. 4D, writing is performed starting from the lower left SF region 40 in the y direction in order. Similarly, one stripe region 20 is written as shown in FIG. 4E, per SF column, by alternately repeating the writing of the first SF layer and the second SF layer. As to the stripe region 22, similar writing operation is performed.

While the XY stage 105 is continuously moving in the x direction (predetermined direction), the writing unit 150 alternately repeats writing, per SF column, the first SF layer and the second SF layer, using the electron beam 200, as shown in FIGS. 4A to 4E. Although the writing is repeated per SF column in this case, it is not restricted thereto. It is also acceptable to alternately perform writing of the first SF layer and writing of the second SF layer, repeatedly per SF region.

As described above, in the examples of FIGS. 2 and 3, since it is configured by two stripe layers and two SF layers, the number of layers for performing multiple writing while shifting the position is four (2×2) layers. In other words, in the case of being configured by a stripe layers and β SF layers, the number of layers for performing multiple writing while shifting the position is α×β=m.

As to multiple writing, there is another way of performing multiple writing by repeatedly writing in the same multiple writing unit region without shifting the position. For example, after writing (shot) in one SF of the first SF layer is completed, the writing (shot) is repeated again in the same SF. In the case of the number of repeating times being "r" per SF layer, for example, when the number of layers for performing multiple writing while shifting the position is "m", the multiplicity N of the shot of the beam irradiating the same position is m×r.

Therefore, when writing a pattern on the target object 101, it is necessary to apportion the dose of each shot so that the total dose of electron beam irradiation of a plurality of shooting times at the same position may be a pre-set dose. A dose D can be controlled by an irradiation time "t" for irradiating the electron beam of a pre-set current density J.

Then, first, the total irradiation time "n" calculation unit 11 reads pattern data from the storage device 140, and calculates an irradiation time necessary for each predetermined mesh region made by virtually dividing the writing region 10. The irradiation time can be obtained as a value calculated by dividing a necessary dose D by a current density J. It is preferable for the dose D to be a value obtained by correcting dimension variation factors, such as a proximity effect, a fogging effect, and a loading effect. When performing multiple writing on a position in a mesh region concerned, the irradiation time acquired for the mesh region concerned serves as the total irradiation time "n" of electron beam irradiation of a plurality of times of shooting the same position.

Then, it becomes an issue how to apportion the total irradiation time "n" among irradiation time "t" of a plurality of shooting times (m×r times) for multiple writing at the same position. As described above, the method of adding an entire remainder (fraction) obtained by dividing the total beam irradiation time (the total writing time) by the multiplicity N to one shot causes a problem in that there is a divergence (imbalanced nature) between the irradiation time of a shot to which the remainder was added and the irradiation time of each of other shots. For example, when the irradiation time is defined according to a gray level value, the irradiation time of the shot to which the remainder described above was added is longer than the irradiation time of each of other shots by up to (multiplicity−1 gray level). For example, when the multiplicity can be set up to 1024, a remainder of up to 1023 gray levels may be generated. For example, when a pattern whose total irradiation time is 2047 gray levels is written by the multiplicity of 1024, there is a possibility of a case in which a specific number-th writing is performed by an irradiation time of 1024 gray levels, and writing of each of other 1023 times is performed by the irradiation time of 1 gray level. Then, in the first embodiment, there will be explained a method of reducing a difference of irradiation time between shots for multiple writing at the same position.

Figure 5:
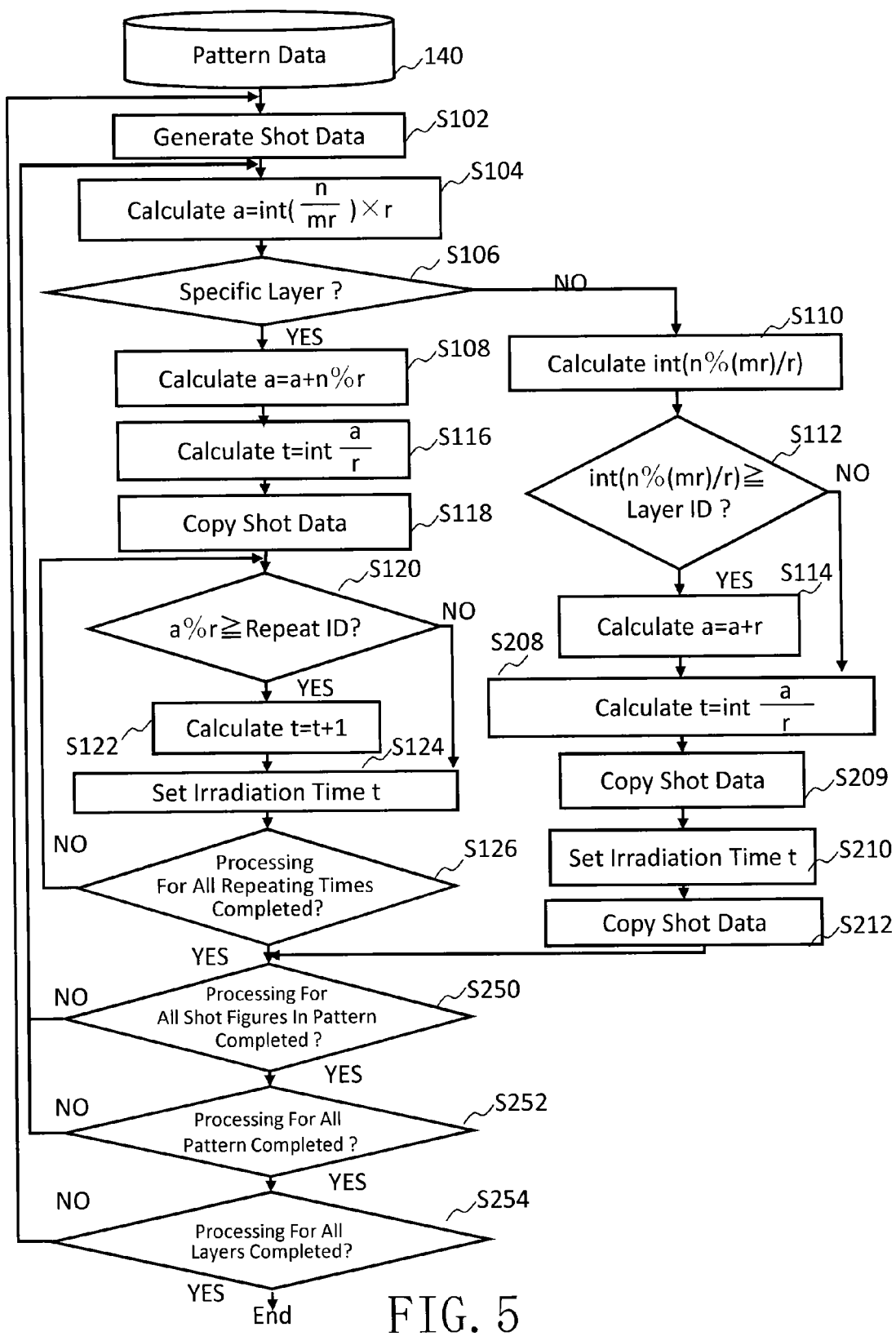
FIG. 5 is a flowchart showing main steps of a setting method of an irradiation time and a generation method of shot data according to the first embodiment.

FIG. 5 is a flowchart showing main steps of a setting method of an irradiation time and a generation method of shot data according to the first embodiment.

In step S102, as a shot data generation step, the shot data generation unit 12 reads pattern data from the storage device 140, and performs data conversion processing of a plurality of steps so as to generate apparatus-specific shot data. The figure pattern defined in the pattern data is divided into a plurality of shot figures, whose size can be shaped by one beam shot, and is generated as shot data. In the shot data, a figure kind, coordinates (X,Y) showing an irradiation position, figure size (L, M), and the like are defined for each shot figure. Since stripe layers and SF layers are defined by shifting the position, the relative position of each SF region 30 of the first layer and the relative position of each SF region 40 of the second layer are different from each other in each stripe region 20 of the first stripe layer. Similarly, the relative position of each SF region 30 of the first layer and the relative position of each SF region 40 of the second layer are different from each other in each stripe region 22 of the second stripe layer. Therefore, since relative positions of a shot figure in respective regions are different from each other, shot-dividing processing is performed for each layer (multiple writing unit region) whose position is shifted. Thus, shot data being different from each other are needed. Here, first, shot data is generated with respect to each SF region 30 (layer ID=1) of the first SF layer in the stripe region 20 of the first stripe layer. After completing dividing one figure pattern into shot figures, such dividing is similarly performed with respect to other figure patterns in the region. Thereby, shot data is generated with respect to all the figure patterns in the region. As will be described later, further, an irradiation time "t" is to be set (defined) in the shot data, for each shot figure.

The sum total irradiation time calculation unit 21 calculates a sum total irradiation time "a" of the electron beam for each layer in the electron beams of a plurality of times of shooting the same position. In the first embodiment, the sum total irradiation time "a" of the electron beam of each layer will be calculated with respect to each of the cases below: the case of a specific layer which was previously set in a plurality of layers (multiple writing unit regions), the case of a layer which is not a specific layer and whose layer ID value assigned excluding the specific layer is less than or equal to a threshold value described below, and the case of a layer which is not a specific layer and whose layer ID value assigned excluding the specific layer is not less than or equal to a threshold value described below. Hereafter, it will be explained concretely.

In step S104, as a reference sum total irradiation time calculation step for each layer, the calculation unit 23 calculates a sum total irradiation time "a" used as a reference. Specifically, the sum total irradiation time "a" used as a reference is calculated by (int(n/(mr))r), where "n" indicates a total irradiation time of electron beams of a plurality of times of shooting the same position, m indicates the number of layers (the number of multiple writing unit regions) of a plurality of layers (multiple writing unit regions) for performing multiple writing while shifting the position, and "r" indicates the number of repeating times of performing multiple writing without shifting the position in each layer. That is, first, an integer value (int(n/(mr))) is calculated, namely the total irradiation time n is divided by a value obtained by multiplying "m" being the number of layers by "r" being the number of times of repeating. When the value (int(n/(mr))) is not divisible, the decimal fraction is rounded off to be an integer value. Then, (int(n/(mr))) is multiplied by the repeating times number "r" to obtain (int(n/(mr))r) which is the sum total irradiation time "a" used as a reference.

FIG. 6 shows an example of the irradiation time apportioned by a writing time (irradiation time) apportionment method according to the first embodiment. FIG. 6 shows the case configured by two stripe layers and two SF layers, namely, "m" being the number of layers for performing multiple writing while shifting the position is four layers. As to each layer, a layer number (ID) is defined as X with respect to a specific layer, and layer numbers (IDs) are defined as 1, 2, and 3 in order from the earlier order of writing with respect to other layers except for the specific layer. Then, in each layer, multiple writing is performed four times (r=4) without shifting the position. That is, FIG. 6 shows the case where multiple writing is performed sixteen times. In the first embodiment, the irradiation time is defined according to a gray level. In FIG. 6, as to a shot figure whose total irradiation time "n" is indicated, for example, by a gray level value of 3999, the sum total irradiation time "a" used as a reference is int(3999/(4× 4))×4=249×4=996 gray levels.

As to a shot figure whose total irradiation time "n" is indicated, for example, by a gray level value of 4000, the sum total irradiation time "a" used as a reference is int(4000/(4× 4))×4=250×4=1000 gray levels.

As to a shot figure whose total irradiation time "n" is indicated, for example, by a gray level value of 4001, the sum total irradiation time "a" used as a reference is int(4001/(4× 4))×4=250×4=1000 gray levels.

As to a shot figure whose total irradiation time "n" is indicated, for example, by a gray level value of 4007, the sum total irradiation time "a" used as a reference is int(4007/(4× 4))×4=250×4=1000 gray levels.

As to a shot figure whose total irradiation time "n" is indicated, for example, by a gray level value of 4008, the sum total irradiation time "a" used as a reference is int(4008/(4×4))×4=250×4=1000 gray levels.

As to a shot figure whose total irradiation time "n" is indicated, for example, by a gray level value of 4009, the sum total irradiation time "a" used as a reference is int(4009/(4×4))×4=250×4=1000 gray levels.

In step S106, as a determination step, the determination unit 27 (a first determination unit) determines whether it is a specific layer previously set in a plurality of layers or not. Let us assume that the first layer in FIG. 6 is a specific layer, for example. If the layer ID of a layer concerned is ID=X, for example, the layer is determined to be a specific layer. If the layer ID of a layer concerned is 1, 2, or 3, for example, it is determined that the layer concerned is not a specific layer.

In step S108, as a sum total irradiation time calculation step for a specific layer, the calculation unit 24 (a specific region sum total irradiation time calculation unit) calculates a sum total irradiation time of a specific layer (for example, the layer ID=1). Specifically, the calculation unit 24 adds a remainder (n % r) (a second remainder), which is obtained by dividing the total irradiation time "n" by the repeating times number "r", to the sum total irradiation time "a" used as a reference, to newly obtain a sum total irradiation time "a". In FIG. 6, as to a specific layer (for example, the layer ID=X) of the shot figure whose total irradiation time "n" is indicated, for example, by a gray level value of 3999, the remainder is (n % r)=3. Therefore, the sum total irradiation time "a" of the specific layer (for example, the layer ID=X) of the shot figure whose total irradiation time "n" is indicated, for example, by a gray level value of 3999 is 996+3=999.

As to a specific layer (for example, the layer ID=X) of the shot figure whose total irradiation time "n" is indicated, for example, by a gray level value of 4000, the remainder is (n % r)=0. Therefore, the sum total irradiation time "a" of the specific layer (for example, the layer ID=X) of the shot figure whose total irradiation time "n" is indicated, for example, by a gray level value of 4000 is 1000+0=1000.

As to a specific layer (for example, the layer ID=X) of the shot figure whose total irradiation time "n" is indicated, for example, by a gray level value of 4001, the remainder is (n % r)=1. Therefore, the sum total irradiation time "a" of the specific layer (for example, the layer ID=X) of the shot figure whose total irradiation time "n" is indicated, for example, by a gray level value of 4001 is 1000+1=1001.

As to a specific layer (for example, the layer ID=X) of the shot figure whose total irradiation time "n" is indicated, for example, by a gray level value of 4007, the remainder is (n % r)=3. Therefore, the sum total irradiation time "a" of the specific layer (for example, the layer ID=X) of the shot figure whose total irradiation time "n" is indicated, for example, by a gray level value of 4007 is 1000+3=1003.

As to a specific layer (for example, the layer ID=X) of the shot figure whose total irradiation time "n" is indicated, for example, by a gray level value of 4008, the remainder is (n % r)=0. Therefore, the sum total irradiation time "a" of the specific layer (for example, the layer ID=X) of the shot figure whose total irradiation time "n" is indicated, for example, by a gray level value of 4008 is 1000+0=1000.

As to a specific layer (for example, the layer ID=X) of the shot figure whose total irradiation time "n" is indicated, for example, by a gray level value of 4009, the remainder is (n % r)=1. Therefore, the sum total irradiation time "a" of the specific layer (for example, the layer ID=X) of the shot figure whose total irradiation time "n" is indicated, for example, by a gray level value of 4009 is 1000+1=1001.

In step S110, as a non-specific layer threshold value calculation step, when a layer concerned was determined not to be a specific layer in the determination step (S106) described above, the calculation unit 26 (a threshold value calculation unit) calculates a threshold value for further distinguishing a plurality of non-specific layers. Specifically, the calculation unit 26 calculates an integer value (int(n %(mr)/r)), as a threshold value, by dividing the total irradiation time "n" by a value, which is calculated by multiplying the layer number "m" by the repeating times number "r", so as to obtain a remainder (n %(mr)) (a first remainder), and further dividing the remainder (n %(mr)) by the repeating times number "r", wherein if the value (int(n %(mr)/r)) is not divisible, the decimal fraction is rounded off to be an integer value.

Therefore, in the case of the shot figure whose total irradiation time "n" is indicated, for example, by a gray level value of 3999, the threshold value is (int(n %(mr)/r))=3.

In the case of the shot figure whose total irradiation time "n" is indicated, for example, by a gray level value of 4000, the threshold value is (int(n %(mr)/r))=0.

In the case of the shot figure whose total irradiation time "n" is indicated, for example, by a gray level value of 4001, the threshold value is (int(n %(mr)/r))=0.

In the case of the shot figure whose total irradiation time "n" is indicated, for example, by a gray level value of 4007, the threshold value is (int(n %(mr)/r))=1.

In the case of the shot figure whose total irradiation time "n" is indicated, for example, by a gray level value of 4008, the threshold value is (int(n %(mr)/r))=2.

In the case of the shot figure whose total irradiation time "n" is indicated, for example, by a gray level value of 4009, the threshold value is (int(n %(mr)/r))=2.

In step S112, as a determination step, the determination unit 28 (a second determination unit) determines whether a layer ID value defined excluding the specific layer is less than or equivalent to the threshold value (int(n %(mr)/r)) calculated in the non-specific layer threshold value calculation step (S110).

Therefore, in the case of the shot figure whose total irradiation time "n" is indicated, for example, by a gray level value of 3999, since the threshold value is 3, if the layer ID of a layer concerned is ID=1, 2, or 3, for example, it is determined to be less than or equal to the threshold value.

In the case of the shot figure whose total irradiation time "n" is indicated, for example, by a gray level value of 4000, since the threshold value is 0, if the layer ID of a layer concerned is ID=1, 2, or 3, for example, it is determined not to be less than or equal to the threshold value.

In the case of the shot figure whose total irradiation time "n" is indicated, for example, by a gray level value of 4001, since the threshold value is 0, if the layer ID of a layer concerned is ID=1, 2, or 3, for example, it is determined not to be less than or equal to the threshold value.

In the case of the shot figure whose total irradiation time "n" is indicated, for example, by a gray level value of 4007, since the threshold value is 1, if the layer ID of a layer concerned is ID=1, it is determined to be less than or equal to the threshold value, and if the layer ID=2 or 3, it is determined not to be less than or equal to the threshold value.

In the case of the shot figure whose total irradiation time "n" is indicated, for example, by a gray level value of 4008, since the threshold value is 2, if the layer ID of a layer concerned is ID=1 or 2, it is determined to be less than or equal to the threshold value, and if the layer ID=3, it is determined not to be less than or equal to the threshold value.

In the case of the shot figure whose total irradiation time "n" is indicated, for example, by a gray level value of 4009, since the threshold value is 2, if the layer ID of a layer concerned is ID=1 or 2, it is determined to be less than or equal to the threshold value, and if the layer ID=3, it is determined not to be less than or equal to the threshold value.

In the case of a layer whose layer ID value is not less than or equal to a threshold value, in other words, a layer which is not a specific layer previously set in a plurality of layers and whose layer ID value defined excluding the specific layer is not less than or equal to a threshold value, a value obtained by adding nothing to the sum total irradiation time "a" used as a reference serves as the sum total irradiation time "a" of electron beams in the layer concerned, in electron beams of a plurality of times of shooting the same position.

In step S114, as a sum total irradiation time calculation step for a non-specific layer, the calculation unit 29 (a sum total irradiation time calculation unit for a non-specific region) calculates a sum total irradiation time of a layer whose layer ID value is not less than or equal to a threshold value, in other words, a layer which is not a specific layer previously set in a plurality of layers and whose layer ID value defined excluding the specific layer is not less than or equal to a threshold value. Specifically, the calculation unit 29 calculates a value by adding the repeating times number "r" to the sum total irradiation time "a" used as a reference and treats the value as the sum total irradiation time "a" of electron beams in the layer concerned.

Therefore, in the case of the shot figure whose total irradiation time "n" is indicated, for example, by a gray level value of 3999, if the layer ID of a layer concerned is ID=1, 2, or 3, for example, the sum total irradiation time "a" is a=996+4=1000.

In the case of the shot figure whose total irradiation time "n" is indicated, for example, by a gray level value of 4000, if the layer ID of a layer concerned is ID=1, 2, or 3, for example, the sum total irradiation time "a" is a=1000+0=1000.

In the case of the shot figure whose total irradiation time "n" is indicated, for example, by a gray level value of 4001, if the layer ID of a layer concerned is ID=1, 2, or 3, for example, the sum total irradiation time "a" is a=1000+0=1000.

In the case of the shot figure whose total irradiation time "n" is indicated, for example, by a gray level value of 4007, if the layer ID of a layer concerned is ID=1, the sum total irradiation time "a" is a=1000+4=1004, and if the layer ID is ID=2 or 3, the sum total irradiation time "a" is a=1000+0=1000.

In the case of the shot figure whose total irradiation time "n" is indicated, for example, by a gray level value of 4008, if the layer ID of a layer concerned is ID=1 or 2, the sum total irradiation time "a" is a=1000+4=1004, and if the layer ID is ID=3, the sum total irradiation time "a" is a=1000+0=1000.

In the case of the shot figure whose total irradiation time "n" is indicated, for example, by a gray level value of 4009, if the layer ID of a layer concerned is ID=1 or 2, the sum total irradiation time "a" is a=1000+4=1004, and if the layer ID is ID=3, the sum total irradiation time "a" is a=1000+0=1000.

As described above, the sum total irradiation time "a" of electron beams of a plurality of times of shooting the same position is calculated for each layer. According to the apportionment method described above, the difference of the sum total irradiation time between layers can be, at most, a repeating times number "r", for each shot figure. Therefore, in the first embodiment, it is possible to suppress a divergence of the sum total irradiation time "a" between layers (writing unit regions).

Next, the shot irradiation time calculation unit 111 calculates the irradiation time "t" of each shot in each layer. First, the specific layer irradiation time calculation unit 31 calculates the irradiation time "t" of each shot in a specific layer (for example, the layer ID=1). Specifically, calculation is performed as follows:

In step S116, as an irradiation time calculation step in a specific layer, the calculation unit 37 obtains, in a specific layer, an integer value (int(a/r)) (a decimal fraction is rounded off when it is not divisible) by dividing the sum total irradiation time "a" by the repeating times number "r", as the irradiation time "t" used as a reference for each shot in the specific layer.

Therefore, in the case of the shot figure whose total irradiation time "n" is indicated, for example, by a gray level value of 3999, the irradiation time "t" used as a reference for each shot in a specific layer (for example, the layer ID=1) is t=int(999/4)=249.

In the case of the shot figure whose total irradiation time "n" is indicated, for example, by a gray level value of 4000, the irradiation time "t" used as a reference for each shot in a specific layer (for example, the layer ID=1) is t=int(1000/4)=250.

In the case of the shot figure whose total irradiation time "n" is indicated, for example, by a gray level value of 4001, the irradiation time "t" used as a reference for each shot in a specific layer (for example, the layer ID=1) is t=int(1001/4)=250.

In the case of the shot figure whose total irradiation time "n" is indicated, for example, by a gray level value of 4007, the irradiation time "t" used as a reference for each shot in a specific layer (for example, the layer ID=1) is t=int(1003/4)=250.

In the case of the shot figure whose total irradiation time "n" is indicated, for example, by a gray level value of 4008, the irradiation time "t" used as a reference for each shot in a specific layer (for example, the layer ID=1) is t=int(1000/4)=250.

In the case of the shot figure whose total irradiation time "n" is indicated, for example, by a gray level value of 4009, the irradiation time "t" used as a reference for each shot in a specific layer (for example, the layer ID=1) is t=int(1001/4)=250.

The irradiation time "t" used as a reference is to be an irradiation time "t" for a shot in the case where, in a specific layer concerned, a remainder (a % r) of dividing the sum total irradiation time "a" by the repeating times number "r" is not greater than or equal to a repeat ID value. That is, the calculation unit 37 (an example of a first shot irradiation time calculation unit) calculates the irradiation time "t" for a shot in the case where, in a specific layer concerned, a remainder (a % r) of dividing the sum total irradiation time "a" by the repeating times number "r" is not greater than or equal to a repeat ID value.

In the case of the shot figure whose total irradiation time "n" is indicated, for example, by a gray level value of 3999, the irradiation time "t" for a shot of repeat ID being ID=4 in a specific layer (for example, the layer ID=X) is t=249.

In the case of the shot figure whose total irradiation time "n" is indicated, for example, by a gray level value of 4000, the irradiation time "t" for a shot of repeat ID being ID=1, 2, 3, or 4 in a specific layer (for example, the layer ID=X) is t=250.

In the case of the shot figure whose total irradiation time "n" is indicated, for example, by a gray level value of 4001, the irradiation time "t" for a shot of repeat ID being ID=2, 3, or 4 in a specific layer (for example, the layer ID=X) is t=250.

In the case of the shot figure whose total irradiation time "n" is indicated, for example, by a gray level value of 4007, the irradiation time "t" for a shot of repeat ID being ID=4 in a specific layer (for example, the layer ID=X) is t=250.

In the case of the shot figure whose total irradiation time "n" is indicated, for example, by a gray level value of 4009, the irradiation time "t" for a shot of repeat ID being ID=2, 3, or 4 in a specific layer (for example, the layer ID=X) is t=250.

In step S118, as a copy processing step, the copy processing unit 32 copies (duplicates) shot data the number of copying times equivalent to "r" being the repeating times number for each shot in a specific layer (for example, the layer ID=X). In this shot data, the irradiation time of each shot has not yet been defined. Moreover, in the first embodiment, since it is impossible at this time to determine to which shot in a specific layer a fraction (remainder) time is to be added, it is preferable to copy (duplicate) the shot data the number of copying times equivalent to "r" being the repeating times number for each shot in a specific layer (for example, the layer ID=X).

In step S120, as a determination step, the determination unit 33 determines whether it is a shot in the case where, in a specific layer concerned, the remainder (a % r) of dividing the sum total irradiation time "a" by the repeating times number "r" is greater than or equal to a value of repeat ID (a certain number-th writing) of multiple writing of repeating times number "r". Therefore, in the case of the shot figure whose total irradiation time "n" is indicated, for example, by a gray level value of 3999, since a remainder (a % r) is 3, when a repeat ID is ID=1, 2, or 3, it is determined that the remainder (a % r) is greater than or equal to the repeat ID value, and when the repeat ID is ID=4, it is determined that the remainder (a % r) it not greater than or equal to the repeat ID value.

In the case of the shot figure whose total irradiation time "n" is indicated, for example, by a gray level value of 4000, since a remainder (a % r) is 0, when a repeat ID is ID=1, 2, 3, or 4 in a specific layer (for example, the layer ID=X), it is determined that the remainder (a % r) is not greater than or equal to the repeat ID value.

In the case of the shot figure whose total irradiation time "n" is indicated, for example, by a gray level value of 4001, since a remainder (a % r) is 1, when a repeat ID is ID=1 in a specific layer (for example, the layer ID=X), it is determined that the remainder (a % r) is greater than or equal to the repeat ID value, and when the repeat ID is ID=2, 3, or 4, it is determined that the remainder (a % r) it not greater than or equal to the repeat ID value.

In the case of the shot figure whose total irradiation time "n" is indicated, for example, by a gray level value of 4007, since a remainder (a % r) is 3, when a repeat ID is ID=1, 2, or 3 in a specific layer (for example, the layer ID=1), it is determined that the remainder (a % r) is greater than or equal to the repeat ID value, and when the repeat ID is ID=4, it is determined that the remainder (a % r) it not greater than or equal to the repeat ID value.

In the case of the shot figure whose total irradiation time "n" is indicated, for example, by a gray level value of 4008, since a remainder (a % r) is 0, when a repeat ID is ID=1, 2, 3, or 4 in a specific layer (for example, the layer ID=X), it is determined that the remainder (a % r) is not greater than or equal to the repeat ID value.

In the case of the shot figure whose total irradiation time "n" is indicated, for example, by a gray level value of 4009, since a remainder (a % r) is 1, when a repeat ID is ID=1 in a specific layer (for example, the layer ID=X), it is determined that the remainder (a % r) is greater than or equal to the repeat ID value, and when the repeat ID is ID=2, 3, or 4, it is determined that the remainder (a % r) it not greater than or equal to the repeat ID value.

In step S122, as an irradiation time calculation step in a specific layer, the calculation unit 34 (an example of a second shot irradiation time calculation unit) calculates a value by adding 1 to an integer value (the irradiation time "t" used as a reference) obtained by dividing the sum total irradiation time "a" by the repeating times number "r", and treats the calculated value as the irradiation time "t" for a shot in the case where, in a specific layer concerned, the remainder (a % r) of dividing the sum total irradiation time "a" by the repeating times number "r" is greater than or equal to a value of repeat ID (a certain number-th writing) of multiple writing of repeating times number "r".

Therefore, in the case of the shot figure whose total irradiation time "n" is indicated, for example, by a gray level value of 3999, the irradiation time "t" of a shot of repeat ID being ID=1, 2, or 3 in a specific layer (for example, the layer ID=X) is t=249+1=250.

In the case of the shot figure whose total irradiation time "n" is indicated, for example, by a gray level value of 4001, the irradiation time "t" of a shot of repeat ID being ID=1 in a specific layer (for example, the layer ID=X) is t=250+1=251.

In the case of the shot figure whose total irradiation time "n" is indicated, for example, by a gray level value of 4007, the irradiation time "t" of a shot of repeat ID being ID=1, 2, or 3 in a specific layer (for example, the layer ID=1) is t=250+1=251.

In the case of the shot figure whose total irradiation time "n" is indicated, for example, by a gray level value of 4009, the irradiation time "t" of a shot of repeat ID being ID=1 in a specific layer (for example, the layer ID=X) is t=250+1=251.

In step S124, as an irradiation time setting step, the setting unit 35 respectively sets an obtained irradiation time "t" to each copied shot data.

In step S126, as a determination step, the determination unit 36 determines whether calculation and setting of the irradiation time "t" for each of all the repeating times in a specific layer (for example, the layer ID=1) have been completed or not. When not completed, it returns to the determination step (S120) and repeats the steps from the determination step (S120) to the determination step (S126) until completed.

On the other hand, the non-specific layer irradiation time calculation unit 41 calculates the irradiation time "t" of each shot in a non-specific layer. Specifically, calculation is performed as follows:

In step S208, as an irradiation time calculation step in a non-specific layer, the calculation unit 42 (an example of a third shot irradiation time calculation unit) obtains, in non-specific layers, an integer value (int(a/r)) (a decimal fraction is rounded off when not divisible) by dividing each sum total irradiation time "a" by the repeating times number "r", as the irradiation time "t" for each shot in a non-specific layer concerned.

In the case of the shot figure whose total irradiation time "n" is indicated, for example, by a gray level value of 3999, since the sum total irradiation time "a" is a=1000 in a non-specific layer (for example, the layer ID=1, 2, or 3), the irradiation time "t" of each shot is t=250.

In the case of the shot figure whose total irradiation time "n" is indicated, for example, by a gray level value of 4000, since the sum total irradiation time "a" is a=1000 in a non-specific layer (for example, the layer ID=1, 2, or 3), the irradiation time "t" of each shot is t=250.

In the case of the shot figure whose total irradiation time "n" is indicated, for example, by a gray level value of 4001, since the sum total irradiation time "a" is a=1000 in a non-specific layer (for example, the layer ID=1, 2, or 3), the irradiation time "t" of each shot is t=250.

In the case of the shot figure whose total irradiation time "n" is indicated, for example, by a gray level value of 4007, in non-specific layers, since the sum total irradiation time "a" is a=1004 when the layer ID is ID=1, for example, the irradiation time "t" of each shot is t=251, and since the sum total irradiation time "a" is a=1000 when the layer ID is ID=2 or 3, for example, the irradiation time "t" of each shot is t=250.

In the case of the shot figure whose total irradiation time "n" is indicated, for example, by a gray level value of 4008, in non-specific layers, since the sum total irradiation time "a" is a=1004 when the layer ID is ID=1 or 2, for example, the irradiation time "t" of each shot is t=251, and since the sum total irradiation time "a" is a=1000 when the layer ID is ID=3, for example, the irradiation time "t" of each shot is t=250.

In the case of the shot figure whose total irradiation time "n" is indicated, for example, by a gray level value of 4009, in non-specific layers, since the sum total irradiation time "a" is a=1004 when the layer ID is ID=1 or 2, for example, the irradiation time "t" of each shot is t=251, and since the sum total irradiation time "a" is a=1000 when the layer ID is ID=3, for example, the irradiation time "t" of each shot is t=250.

As described above, since the sum total irradiation time "a" is always a multiple of the repeating times number "r" in a non-specific layer, the same irradiation time "t" can be obtained in each of non-specific layers.

In step S209, as a copy processing step, the copy processing unit 46 copies (duplicates) shot data the number of copying times equivalent to the number of non-specific layers (or the number of copying times equivalent to (the number of non-specific layers−1). In this shot data, the irradiation time of each shot has not yet been defined.

In step S210, as an irradiation time setting step, the setting unit 44 respectively sets the calculated irradiation time "t" to each shot data in each of the non-specific layers.

In step S212, as a copy processing step, the copy processing unit 48 copies (duplicates) shot data the number of copying times equivalent to the number of repeating times in each of the non-specific layers. In non-specific layers, since the irradiation time "t" of each shot in each layer is the same with each other, the shot data in which the irradiation time "t" has been set can be copied and used as it is. Therefore, in non-specific layers, it is sufficient to generate only one shot data and it is unnecessary to generate other shot data, and thus, the processing time can be reduced.

In step S250, as a determination step, the determination unit 50 determines whether processing for all the shot figures in a pattern has been completed or not. When not completed, it returns to the reference sum total irradiation time calculation step (S104) for each layer, and repeats the steps from the reference sum total irradiation time calculation step (S104) to the copy processing step (S212) for each layer until completed. When processing for all the shot figures in a pattern has been completed, it goes to step S252.

In step S252, as a determination step, the determination unit 52 determines whether setting processing of an irradiation time has been completed for all the patterns in pattern data. When not completed, it returns to the reference sum total irradiation time calculation step (S104) for each layer, and repeats the steps from the reference sum total irradiation time calculation step (S104) to the determination step (S250) for each layer until completed. When processing for all the shot figures in a pattern has been completed, it goes to S254.

In step S254, as a determination step, the determination unit 54 determines whether setting processing of the irradiation time with respect to each of all the layers for performing multiple writing while moving the position has been completed or not. When not completed, it returns to the shot data generation step (S102) and repeats the steps from the shot data generation step (S102) to the determination step (S252) until completed. When the processing for each of all the layers is completed, the setting processing of an irradiation time has been finished.

The shot data in which the irradiation time has been set is stored in the storage device 142. Then, as a writing step, the writing control unit 56 controls the control circuit 120 to cause the writing unit 150 to perform writing processing. The writing unit 150 emits the electron beam 200 so that it may become the sum total irradiation time concerned in each layer, so as to write a pattern on the target object 100. Moreover, the writing unit 150 emits, for each layer, the electron beam 200 so that the irradiation time "t" of each shot in a layer may become the sum total irradiation time concerned, so as to write a pattern on the target object 100.

The electron beam 200 emitted from the electron gun assembly 201 (emission unit), when passing through the blanking deflector 212, is controlled to pass through the blanking aperture 214 by the blanking deflector 212 when the beam is in the ON state, and is deflected by the blanking deflector 212 so that the entire beam may be blocked by the blanking aperture 214 when the beam is in the OFF state. The electron beam 200, passing through the blanking aperture 214 while changing the state from the beam OFF to the beam ON and lastly again to the beam OFF, serves as one shot of the electron beam. The blanking deflector 212 controls the direction of the passing electron beam 200 to alternately generate the "beam ON" state and the "beam OFF" state. For example, it is preferable to apply a voltage to the blanking deflector 212 when in the "beam OFF" state and not to apply a voltage when in the "beam ON" state. The dose per shot of the electron beam 200 to irradiate the target object 101 is adjusted depending upon the irradiation time of each shot.

As described above, each shot of the electron beam 200, which is generated by passing through the blanking deflector 212 and the blanking aperture 214, irradiates the whole of the first shaping aperture 203 having a quadrangular opening by the illumination lens 202. Here, the electron beam 200 is first shaped to be a quadrangle. Then, after having passed through the first shaping aperture 203, the electron beam 200 of the first aperture image is projected onto the second shaping aperture 206 by the projection lens 204. The first aperture image on the second shaping aperture 206 is deflection-controlled by the deflector 205 so as to change (variably shape) the shape and size of the beam. Such variable beam shaping is performed for each shot, and, usually, each shot is shaped to have a different shape and size. Then, after having passed through the second shaping aperture 206, the electron beam 200 of the second aperture image is focused by the objective lens 207, and deflected by the main deflector 208 and the sub deflector 209 to reach to irradiate a desired position on the target object 101 placed on the XY stage 105 which moves continuously. FIG. 1 shows the case of using a multiple stage deflection, namely the two stage deflector of the main and sub deflectors, for position deflection. In such a case, what is needed is to deflect the electron beam 200 of a shot concerned to the reference position of a subfield (SF), which is made by dividing the stripe region virtually, by the main deflector 208 while following the stage movement, and to deflect the beam of the shot concerned to each irradiation position in the SF by the sub deflector 209. When performing multiple writing, writing processing is performed according to the writing procedure described above.

FIG. 7 shows an example of the irradiation time apportioned by a writing time (irradiation time) apportionment method according to a comparative example against the first embodiment. The comparative example (referred to as tshot, hereinafter) of FIG. 7 shows the case configured by two stripe layers and two SF layers, namely, "m" being the number of layers for performing multiple writing while shifting the position is four layers. As to each layer, a layer number (ID) is defined as 1, 2, 3, or 4 in order from the earlier order of writing. It shows the case in which multiple writing is repeatedly performed four times (r=4) without shifting the position. That is, multiple writing is performed sixteen times. In FIG. 7, the irradiation time is defined according to a gray level. In the comparative example (tshot) shown in FIG. 7, the irradiation time of each shot is set by a method of adding an entire remainder of dividing the total irradiation time "n" by the number of times of writing (multiplicity N=16) to the first shot. In the comparative example of FIG. 7, in the case of n=3999, difference of fifteen gray levels (gray level difference of (multiplicity−1)) is generated in the irradiation time between shots. Therefore, divergence is generated in the irradiation time between shots. On the other hand, according to the first embodiment, as shown in FIG. 6, it is possible to suppress the difference in the irradiation time between shots to 1 gray level.

FIG. 8 shows an example of the irradiation time apportioned by a writing time (irradiation time) apportionment method according to another comparative example against the first embodiment. The comparative example (referred to as ishot, hereinafter) of FIG. 8 shows the case configured by two stripe layers and two SF layers, namely, "m" being the number of layers for performing multiple writing while shifting the position is four layers. As to each layer, a layer number (ID) is defined as 1, 2, 3, or 4 in order from the earlier order of writing. It shows the case in which multiple writing is repeatedly performed four times (r=4) without shifting the position. That is, multiple writing is performed sixteen times. A writing number (ID) is defined in order of processing when performing writing processing of each number of times of multiple writing. In FIG. 8, the irradiation time is defined according to a gray level.

Figure 9:
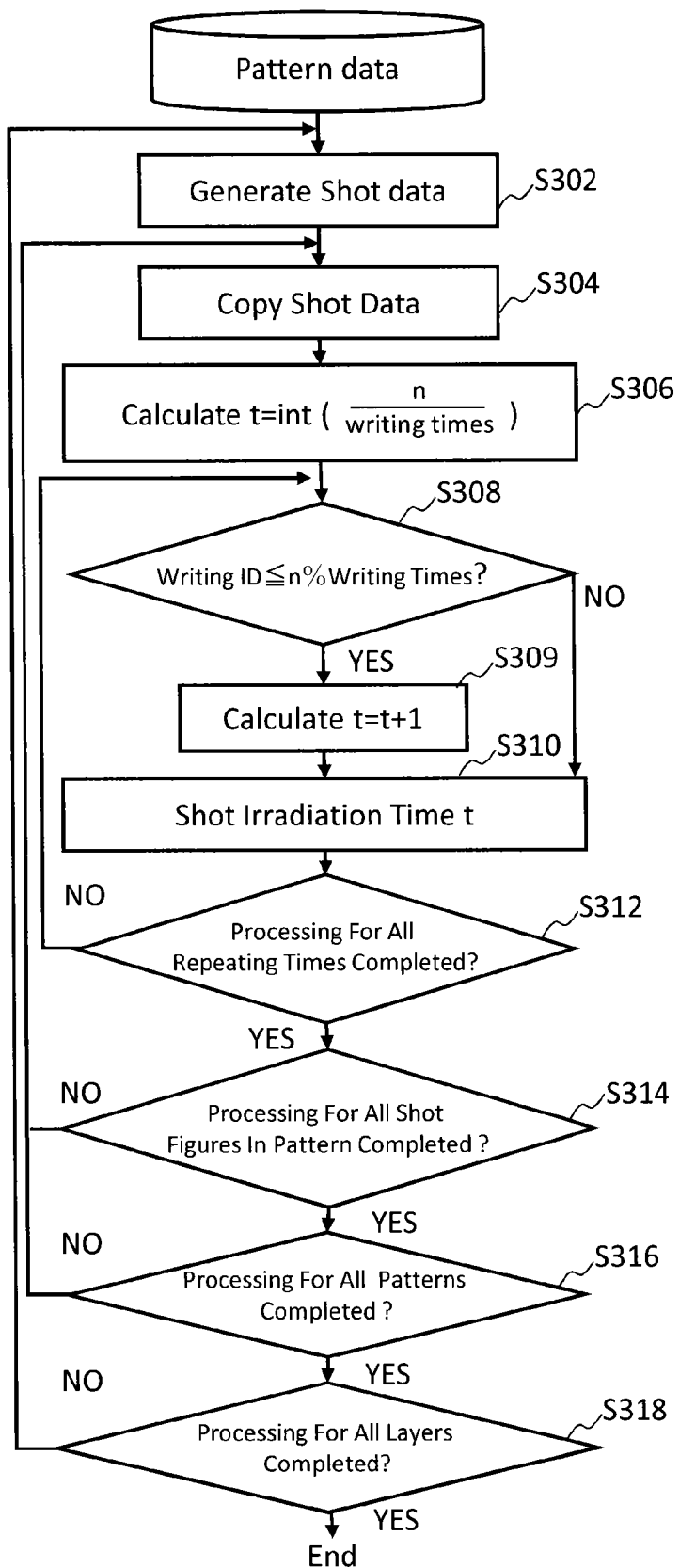
FIG. 9 is a flowchart showing each step of an irradiation time apportionment method according to another comparative example against the first embodiment.

FIG. 9 is a flowchart showing each step of an irradiation time apportionment method according to another comparative example against the first embodiment. FIG. 9 shows the apportionment method of the comparative example (ishot) of FIG. 8.

First, as a shot data generation step (S302), pattern data is read to generate shot data. Then, as a shot data copy step (S304), shot data is copied so that the shot data may be prepared for the repeating times number "r" for the layer concerned. Next, as an irradiation time calculation step (S306), the irradiation time "t" used as a reference of the irradiation time of each shot is calculated. Here, the irradiation time "t" used as a reference is calculated as an integer value (int(n/number of writing times)) (a decimal fraction is rounded off when it is not divisible) obtained by dividing the total irradiation time "n" of electron beams of a plurality of times of shooting the same position by the number of times of writing (maximum writing ID value) of multiple writing.

In the case of the shot figure whose total irradiation time "n" is indicated, for example, by a gray level value of 3999, the irradiation time "t" used as a reference is t=249.

In the case of the shot figure whose total irradiation time "n" is indicated, for example, by a gray level value of 4000, the irradiation time "t" used as a reference is t=250.

In the case of the shot figure whose total irradiation time "n" is indicated, for example, by a gray level value of 4001, the irradiation time "t" used as a reference is t=250.

Next, in a determination step (S308), for each writing ID, it is determined whether a writing ID concerned is less than or equal to a remainder (n % writing times) of dividing the total irradiation time "n" by the number of times of writing (maximum writing ID value) of multiple writing. In an irradiation time calculation step (S309), when a writing ID is less than or equal to the remainder (n % writing times), a value obtained by adding 1 to the irradiation time "t" used as a reference is calculated as the irradiation time "t" for the writing ID concerned. Next, in a setting step (S310), each calculated irradiation time "t" is set for each writing ID. In a determination step (S312), it is determined whether calculation and setting of the irradiation time "t" for each of all the repeating times in a layer concerned have been completed or not. When there exists a repeat ID for which the processing has not yet been finished, it returns to the determination step (S308) and repeats the steps from the determination step (S308) to the determination step (S312) until the calculation and setting of the irradiation time "t" for each of all the repeating times have been completed. Next, when the calculation and setting of the irradiation time "t" for each of all the repeating times have been completed, in a determination step (S314), it is determined whether calculation and setting of the irradiation time "t" for each of all the shot figures in a pattern have been completed or not. When there exists a shot figure for which the processing has not yet been finished, it returns to the shot data copy step (S304) and repeats the steps from the shot data copy step (S304) to the determination step (S314) until the calculation and setting of the irradiation time "t" for each of all the shot figures in a pattern have been completed. Next, when the calculation and setting of an irradiation time "t" for all the shot figures in a pattern have been completed, in a determination step (S316), it is determined whether calculation and setting of the irradiation time "t" for each of all the patterns in a layer concerned have been completed or not. When there exists a pattern for which the processing has not yet been completed, it returns to the shot data copy step (S304) and repeats the steps from the shot data copy step (S304) to the determination step (S316) until the calculation and setting of the irradiation time "t" for each of all the patterns have been completed. Next, in a determination step (S318), it is determined whether calculation and setting of the irradiation time "t" for each of all the layers have been completed or not. When there exists a layer for which the processing has not yet been completed, it returns to the shot data generation step (S302) and repeats the steps from the shot data generation step (S302) to the determination step (S318) until the calculation and setting of the irradiation time "t" for each of all the layers have been completed.

By performing the processing as described above, in the case of the shot figure whose total irradiation time "n" is indicated, for example, by a gray level value of 3999, since the remainder (n % writing times) is 15, when the writing ID is ID=1 to 15, the irradiation time "t" is t=249+1=250, and when the writing ID is ID=16, the irradiation time "t" is t=249.

In the case of the shot figure whose total irradiation time "n" is indicated, for example, by a gray level value of 4000, since the remainder (n % writing times) is 0, when the writing ID is ID=1 to 16, the irradiation time "t" is t=250.

In the case of the shot figure whose total irradiation time "n" is indicated, for example, by a gray level value of 4001, since the remainder (n % writing times) is 1, when the writing ID is ID=1, the irradiation time "t" is t=250+1=251, and when the writing ID is ID=2 to 16, the irradiation time "t" is t=250.

As described above, in the comparative example (ishot), difference of the irradiation time between shots of each writing time in multiple writing at the same position can be suppressed to 1 gray level. However, in the comparative example (ishot), since it is impossible to determine a writing ID for which 1 is added to the irradiation time used as a reference until the remainder (n % writing times) has been calculated, it is difficult, even in the same layer, to copy shot data where the irradiation time has already been defined. Therefore, it becomes necessary, for each writing ID, to set (define) an irradiation time to the shot data in which an irradiation time has not yet been defined. This causes the data processing time to be long. On the other hand, according to the first embodiment, since a fraction of the irradiation time is included only in a specific layer, it is sufficient in other non-specific layers to copy the shot data in which the irradiation time has already been defined the number of copying times equivalent to the repeating times. Therefore, by using the method of the first embodiment, the data processing time can be shorter than that of the comparative example (ishot).

As described above, according to the first embodiment, it is possible to suppress divergence of sum total irradiation time between writing unit regions. Consequently, the imbalanced nature of the irradiation time between shots can be suppressed. Accordingly, degradation of writing processing speed can be reduced.

Embodiment 2

In the first embodiment, difference of irradiation time between shots of each writing time in multiple writing at the same position can be suppressed to 1 gray level, and, in non-specific layers, it is sufficient to copy shot data in which the irradiation time has already been defined the number of copying times equivalent to the repeating times. However, in the first embodiment, with respect to a specific layer, it is difficult to copy shot data in which the irradiation time has already been defined. Then, in the second embodiment, there will be explained a method capable of copying shot data in which the irradiation time has already been defined even with respect to a specific layer.

Figure 10:
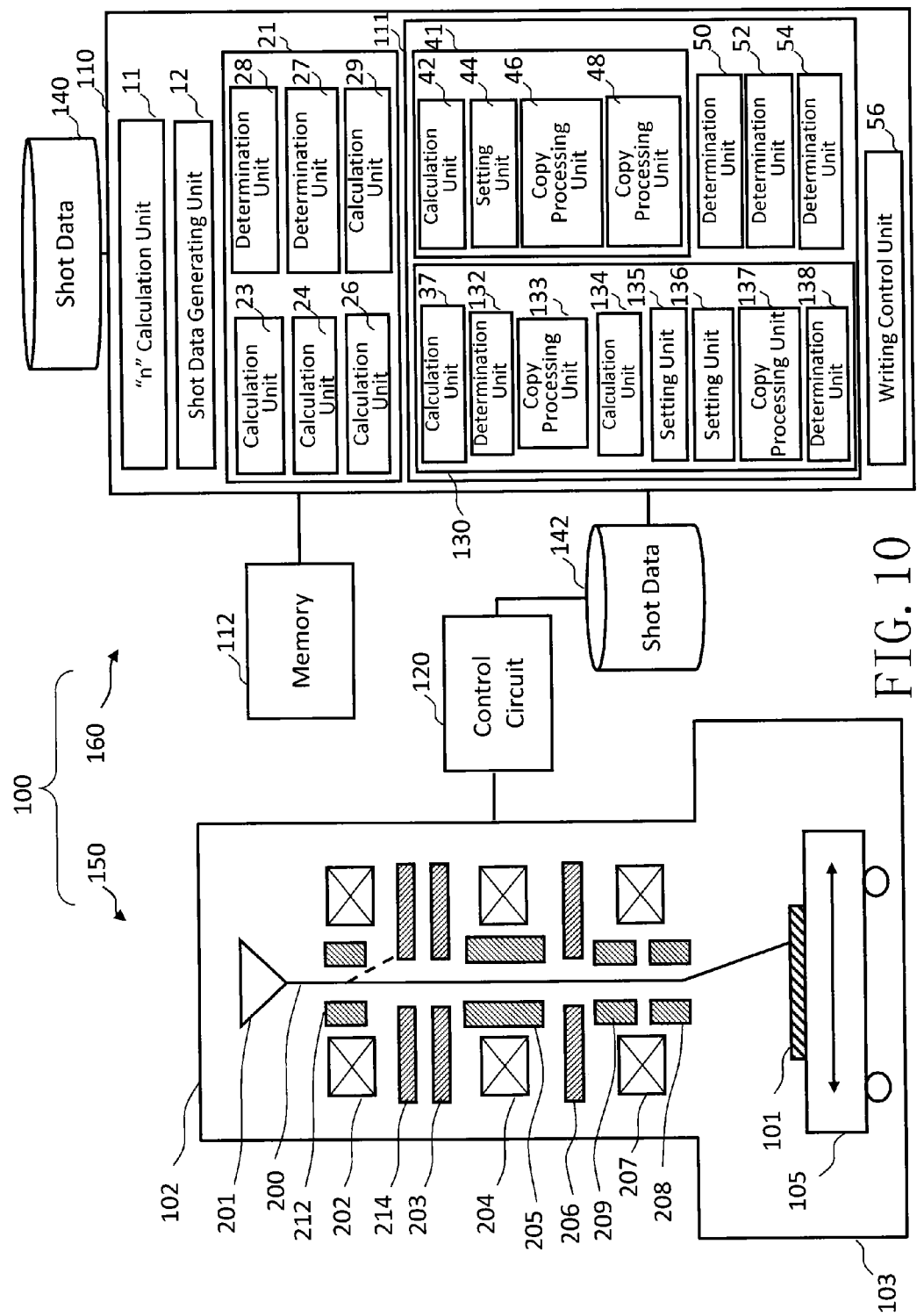
FIG. 10 is a schematic diagram showing a configuration of a writing apparatus according to the second embodiment.

FIG. 10 is a schematic diagram showing a configuration of a writing apparatus according to the second embodiment. FIG. 10 is the same as FIG. 1 except that a specific layer irradiation time calculation unit 130 is included in place of the specific layer irradiation time calculation unit 31. That is, in the shot irradiation time calculation unit 111, there are arranged the specific layer irradiation time calculation unit 130, the non-specific layer irradiation time calculation unit 41, and the determination units 50, 52, and 54. Each function such as specific layer irradiation time calculation unit 130, the non-specific layer irradiation time calculation unit 41, and the determination units 50, 52, and 54 may be configured by software such as a program causing a computer to implement these functions or by hardware such as an electronic circuit. Alternatively, it may be configured by a combination of software and hardware.

Moreover, in the specific layer irradiation time calculation unit 130, there are arranged calculation units 37 and 134, copy processing units 133 and 137, determination units 132, and 138, and setting units 135 and 136. Each function such as the calculation units 37 and 134, the copy processing units 133 and 137, the determination units 132, and 138, and the setting units 135 and 136 may be configured by software such as a program causing a computer to implement these functions or by hardware such as an electronic circuit. Alternatively, it may be configured by a combination of software and hardware.

Figure 11:
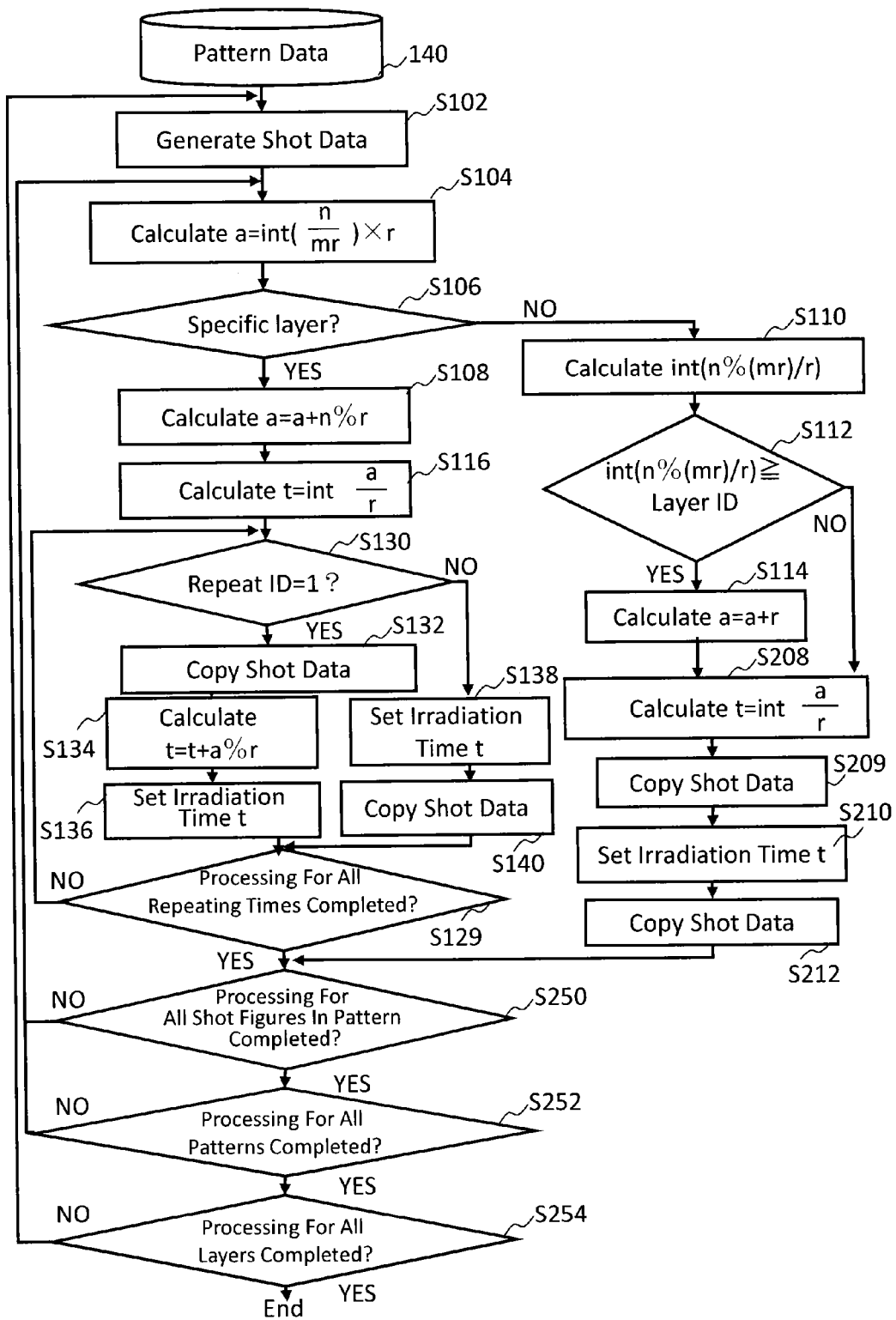
FIG. 11 is a flowchart showing main steps of a setting method of an irradiation time and a generation method of shot data according to the second embodiment.

FIG. 11 is a flowchart showing main steps of a setting method of an irradiation time and a generation method of shot data according to the second embodiment. In FIG. 11, steps from the shot data generation step (S102) to the irradiation time calculation step (S116) in a specific layer are the same as those in FIG. 5. Moreover, steps from the irradiation time calculation step (S208) in a non-specific layer to the determination step (S254) are the same as those in FIG. 5. The content of the second embodiment may be the same as that of the first embodiment except what is described below.

FIG. 12 shows an example of the irradiation time apportioned by a writing time (irradiation time) apportionment method according to the second embodiment. FIG. 12 shows, as well as FIG. 6, the case configured by two stripe layers and two SF layers, namely, "m" being the number of layers for performing multiple writing while shifting the position is four layers. As to each layer, a layer number (ID) is defined as X with respect to a specific layer, and layer numbers (IDs) are defined as 1, 2, and 3 in order from the earlier order of the writing with respect to other layers except for the specific layer. Then, in each layer, multiple writing is performed four times (r=4) without shifting the position. That is, it shows the case where multiple writing is performed sixteen times. In the second embodiment, the irradiation time is defined according to a gray level.

In the second embodiment, as shown in FIG. 12, in a specific layer, the remainder (a % r) of dividing the sum total irradiation time "a" by the repeating times number "r" is added to the first shot (repeat ID=1) of the specific layer ID.

According to the second embodiment, in an irradiation time calculation step (S116) for a specific layer, the irradiation time "t" used as a reference is the irradiation time "t" for the second and subsequent shots in a specific layer concerned, not for the first shot (repeat ID=1) in the specific layer concerned. Therefore, the calculation unit 37 (an example of the first shot irradiation time calculation unit), with respect to a specific layer in a plurality of layers, obtains an integer value (int(a/r)) (a decimal fraction is rounded off when it is not divisible) by dividing the sum total irradiation time "a" by the repeating times number "r", as the irradiation time "t" for the second and subsequent shots of charged particle beams of a plurality of times of shooting the same position.

Therefore, in the case of a shot figure whose total irradiation time "n" is indicated, for example, by a gray level value of 3999, the irradiation time "t" for a shot of repeat ID=2, 3, or 4 in a specific layer (for example, the layer ID=X) is t=249.

In the case of a shot figure whose total irradiation time "n" is indicated, for example, by a gray level value of 4000, the irradiation time "t" for a shot of repeat ID=2, 3, or 4 in a specific layer (for example, the layer ID=X) is t=250.

In the case of a shot figure whose total irradiation time "n" is indicated, for example, by a gray level value of 4001, the irradiation time "t" for a shot of repeat ID=2, 3, or 4 in a specific layer (for example, the layer ID=X) is t=250.

In the case of a shot figure whose total irradiation time "n" is indicated, for example, by a gray level value of 4007, the irradiation time "t" for a shot of repeat ID=2, 3, or 4 in a specific layer (for example, the layer ID=X) is t=250.

In the case of a shot figure whose total irradiation time "n" is indicated, for example, by a gray level value of 4009, the irradiation time "t" for a shot of repeat ID=2, 3, or 4 in a specific layer (for example, the layer ID=X) is t=250.

In step S130, as a determination step, the determination unit 132 determines whether the repeat ID in a specific layer is 1 (the first shot) or not.

In step S132, as a copy processing step, the copy processing unit 133 copies (duplicates) shot data for the first shot in the specific layer (for example, the layer ID=1).

In step S134, as an irradiation time calculation step in a specific layer, with respect to a specific layer in a plurality of layers, the calculation unit 34 (an example of a second shot irradiation time calculation unit) calculates an integer value (int(a/r)) (a decimal fraction is rounded off when it is not divisible) by dividing the sum total irradiation time "a" by the repeating times number "r", adds the remainder (a % r) of dividing the sum total irradiation time "a" by the repeating times number "r" to the calculated integer value, and treats the value obtained by the addition, as the irradiation time "t" for the first shot of electron beams of a plurality of times of shooting the same position.

Therefore, in the case of the shot figure whose total irradiation time "n" is indicated, for example, by a gray level value of 3999, the irradiation time "t" of a shot of repeat ID being ID=1 in a specific layer (for example, the layer ID=X) is t=249+3=252.

In the case of the shot figure whose total irradiation time "n" is indicated, for example, by a gray level value of 4001, the irradiation time "t" of a shot of repeat ID being ID=1 in a specific layer (for example, the layer ID=1) is t=250+1=251.

In the case of the shot figure whose total irradiation time "n" is indicated, for example, by a gray level value of 4007, the irradiation time "t" of a shot of repeat ID being ID=1 in a specific layer (for example, the layer ID=X) is t=250+3=253.

In the case of the shot figure whose total irradiation time "n" is indicated, for example, by a gray level value of 4009, the irradiation time "t" of a shot of repeat ID being ID=1 in a specific layer (for example, the layer ID=1) is t=250+1=251.

In step S136, as an irradiation time setting step, the setting unit 135 sets (defines) the obtained irradiation time "t" to the shot data which has been copied for the first shot in a specific layer.

In step S138, as an irradiation time setting step, the setting unit 136 sets (defines), in the shot data originally generated, the integer value (int(a/r)) (a decimal fraction is rounded off when it is not divisible) obtained in the specific layer by dividing the sum total irradiation time "a" by the repeating times number "r", as the irradiation time of a shot for the second and subsequent shots (repeat ID=2, 3, or 4) in the specific layer.

Although, in the example of FIG. 11, shot data generated originally is used as the shot data for the second and subsequent shots (repeat ID=2, 3, or 4) in a specific layer and copied shot data is used for the first shot in the specific layer, it may be vice versa.

In step S140, as a copy processing step, the copy processing unit 137 copies (duplicates) shot data, in which the irradiation time "t" was defined in the irradiation time setting step (S136), the number of copying times equivalent to the number of shots of the second and subsequent time (repeat ID=2, 3, or 4) in a specific layer. In the second and subsequent shots (repeat ID=2, 3, or 4) in the specific layer, since the irradiation time "t" of each shot is the same with each other, the shot data in which the irradiation time "t" has been set can be copied and used as it is. Therefore, in the second and subsequent shots (repeat ID=2, 3, or 4) in the specific layer, it is sufficient to generate only one shot data, and it is unnecessary to generate other shot data. Thus, the processing time can be reduced.

In step S142, as a determination step, the determination unit 138 determines whether calculation and setting of the irradiation time "t" for each of all the repeating times in a specific layer (for example, the layer ID=1) have been completed or not. When not completed, it returns to the determination step (S130) and repeats the steps from the determination step (S130) to the determination step (S142) until completed.

By the configuration as described above, according to the second embodiment, since the remainder (a % r) of dividing the sum total irradiation time "a" by the repeating times number "r" is added as a fraction, it is possible to suppress the difference of irradiation time between shots to be at most (repeating times number "r"−1) gray level as shown in FIG. 12. Although this gray level difference is wider than that of the first embodiment in which the difference is at most 1 gray level, it is possible to greatly reduce the gray level difference compared with that of the comparative example (tshot) in which the difference is at most (multiplicity (mr)−1) gray level. The maximum difference (repeating times number "r"−1) gray level is sufficiently within the tolerance level.

Moreover, in the second embodiment, since the fraction of the irradiation time is included only in the first shot in a specific layer, it is sufficient in other non-specific layers to copy the shot data, in which the irradiation time has already been defined, the number of copying times equivalent to the repeating times. Furthermore, in the second and subsequent shots in the specific layer, it is sufficient to respectively copy the shot data, in which the irradiation time has already been defined, the number of copying times equivalent to the repeating times of the second and subsequent shots. Therefore, according to the second embodiment, the data processing time can be shorter than that of the first embodiment, needless to say shorter than that of the comparative example (ishot). Moreover, since the second embodiment is the same as the comparative example (tshot) in that the fraction of the irradiation time is included only in the first shot in a specific layer, the data processing time can be reduced similarly to the comparative example (tshot).

Embodiment 3

Although, according to the second embodiment, a difference of at most (repeating times "r"−1) gray level may be generated in irradiation time between shots, such a difference can be further smaller according to a method of the third embodiment.

Figure 13:
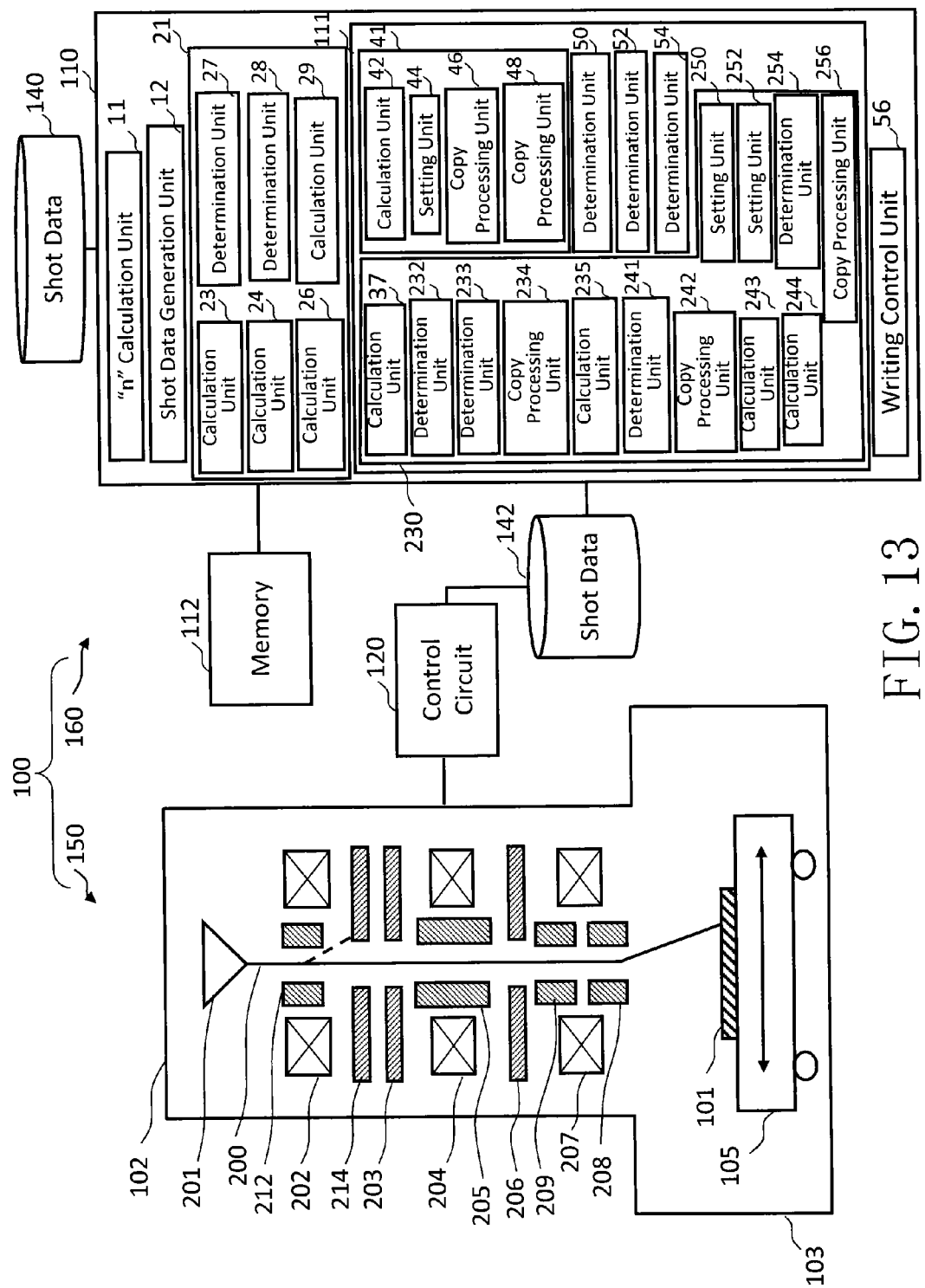
FIG. 13 is a schematic diagram showing a configuration of a writing apparatus according to the third embodiment.

FIG. 13 is a schematic diagram showing a configuration of a writing apparatus according to the third embodiment. FIG. 13 is the same as FIG. 1 except that a specific layer irradiation time calculation unit 230 is included in place of the specific layer irradiation time calculation unit 31. That is, in the shot irradiation time calculation unit 111, there are arranged the specific layer irradiation time calculation unit 230, the non-specific layer irradiation time calculation unit 41, and the determination units 50, 52, and 54. Each function such as the specific layer irradiation time calculation unit 230, the non-specific layer irradiation time calculation unit 41, and the determination units 50, 52, and 54 may be configured by software such as a program causing a computer to implement these functions or by hardware such as an electronic circuit. Alternatively, it may be configured by a combination of software and hardware.

In the specific layer irradiation time calculation unit 230, there are arranged calculation units 37, 235, 243 and 244, copy processing units 234, 242, and 256, determination units 232, 233, 241, and 254, and setting units 250 and 252. Each function such as the calculation units 37, 235, 243 and 244, the copy processing units 234, 242, and 256, the determination units 232, 233, 241, and 254, and the setting units 250 and 252 may be configured by software such as a program causing a computer to implement these functions or by hardware such as an electronic circuit. Alternatively, it may be configured by a combination of software and hardware.

Figure 14:
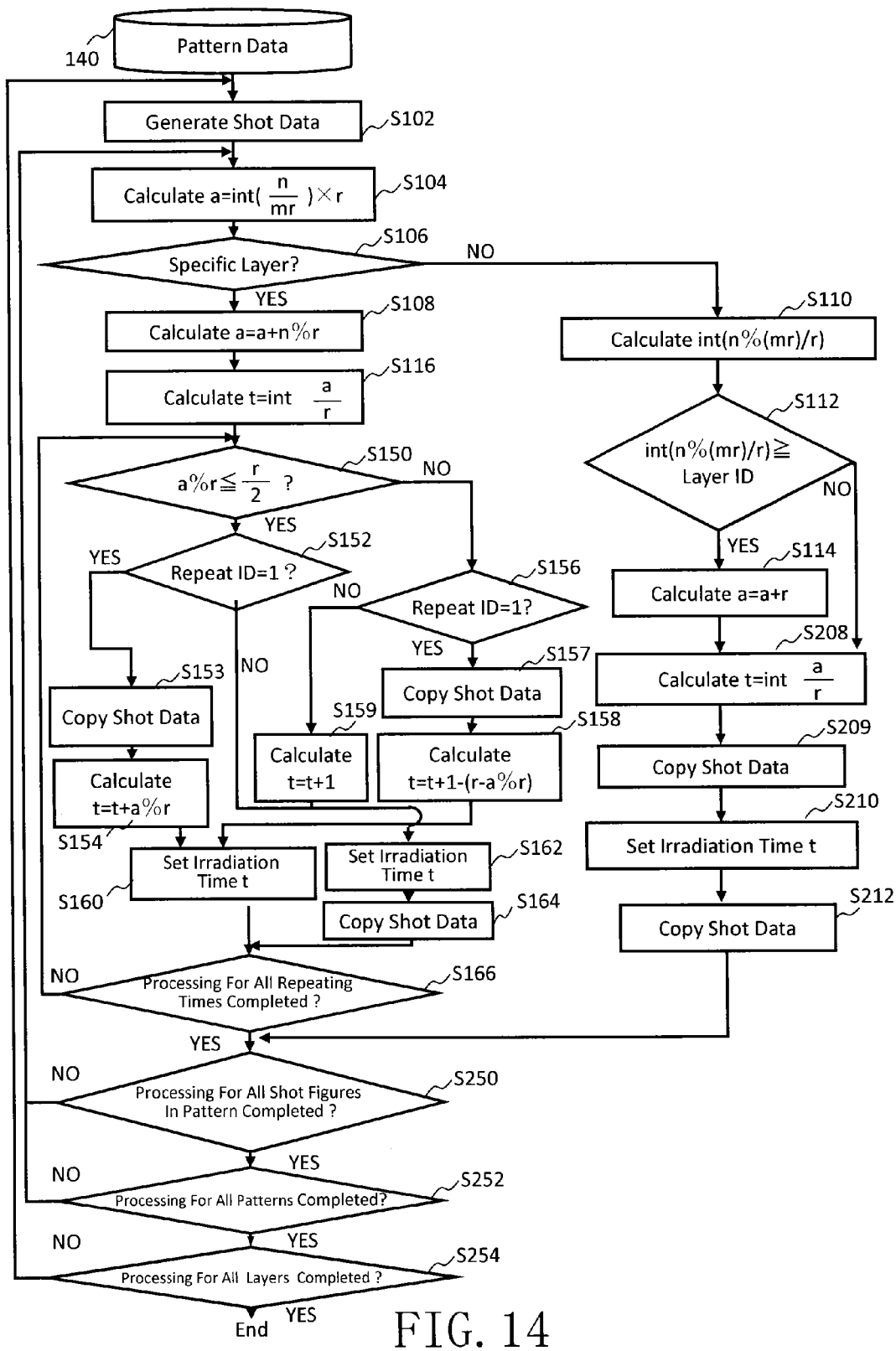
FIG. 14 is a flowchart showing main steps of a setting method of an irradiation time and a generation method of shot data according to the third embodiment.
Figure 16:
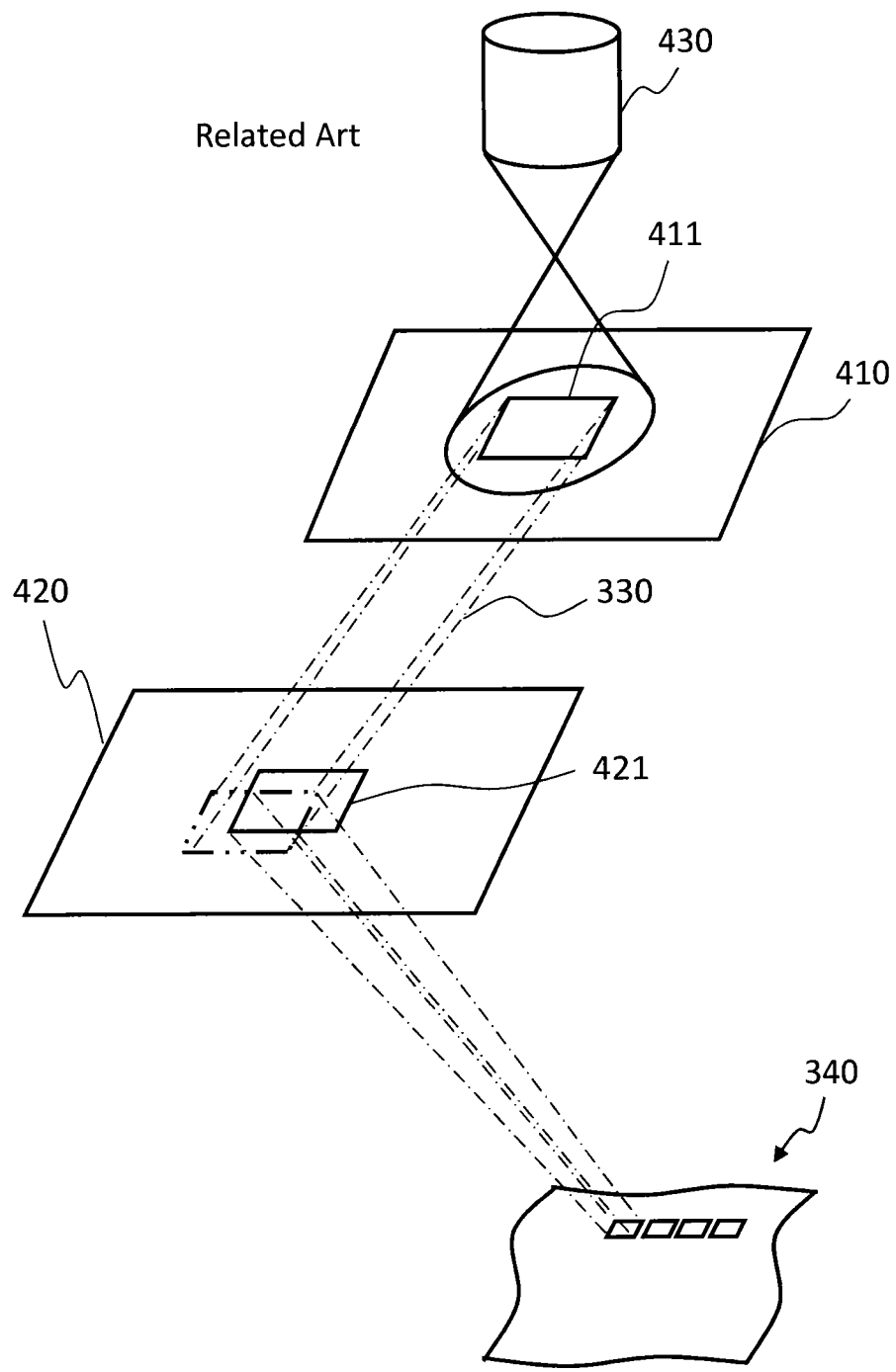
FIG. 16 is a schematic diagram explaining operations of a variable shaped electron beam writing apparatus.

FIG. 14 is a flowchart showing main steps of a setting method of an irradiation time and a generation method of shot data according to the third embodiment. In FIG. 14, steps from the shot data generation step (S102) to the irradiation time calculation step (S116) in a specific layer are the same as those in FIG. 5. Moreover, steps from the irradiation time calculation step (S208) in a non-specific layer to the determination step (S254) are also the same as those in FIG. 5. The content of the third embodiment may be the same as that of the first or the second embodiment except what is described below.

FIG. 15 shows an example of the irradiation time apportioned by a writing time (irradiation time) apportionment method according to the third embodiment. FIG. 15 shows, as well as FIG. 6, the case configured by two stripe layers and two SF layers, namely, "m" being the number of layers for performing multiple writing while shifting the position is four layers. As to each layer, a layer number (ID) is defined as X with respect to a specific layer, and layer numbers (IDs) are defined as 1, 2, and 3 in order from the earlier order of the writing with respect to other layers except for the specific layer. Then, in each layer, multiple writing is performed four times (r=4) without shifting the position. That is, it shows the case where multiple writing is performed sixteen times. In the third embodiment, the irradiation time is defined according to a gray level.

In the third embodiment, as shown in FIG. 15, the irradiation time is increased or decreased at the first shot (repeat ID=1) of a specific layer ID compared with the irradiation time of the second and subsequent shots (repeat ID=2 to 4).

According to the third embodiment, in the irradiation time calculation step (S116) in a specific layer, the irradiation time "t" used as a reference is the irradiation time "t" for the second and subsequent shots in the specific layer when the remainder (a % r) of dividing the sum total irradiation time "a" by the repeating times number "r" is less than or equal to ½ of the repeating times number "r". Therefore, the calculation unit 37 (an example of the first shot irradiation time calculation unit), with respect to a specific layer in a plurality of layers, calculates an integer value (int(a/r)) (a decimal fraction is rounded off when it is not divisible) by dividing the sum total irradiation time "a" by the repeating times number "r", as the irradiation time "t" for the second and subsequent shots of electron beams of a plurality of times of shooting the same position when the remainder (a % r) of dividing the sum total irradiation time "a" by the repeating times number "r" is less than or equal to ½ of the repeating times number "r".

Therefore, in the case of a shot figure whose total irradiation time "n" is indicated, for example, by a gray level value of 3999 or 4007, since the remainder (a % r) of dividing the sum total irradiation time "a" by the repeating times number "r" in the specific layer is 3, it does not correspond to being less than or equal to ½ of the repeating times number "r". (In the example of FIG. 15, since r=4, determination is performed whether the remainder is less than or equal to 2.)

In the case of a shot figure whose total irradiation time "n" is indicated, for example, by a gray level value of 4000, 4001, 4008, or 4009, since the remainder (a % r) of dividing the sum total irradiation time "a" by the repeating times number "r" in the specific layer is respectively 0, 1, 0, and 1, it corresponds to being less than or equal to ½ of the repeating times number "r". (In the example of FIG. 15, since r=4, determination is performed whether the remainder is less than or equal to 2.)

In the case of a shot figure whose total irradiation time "n" is indicated, for example, by a gray level value of 4000, the irradiation time "t" for a shot of repeat ID being ID=2, 3, or 4 in a specific layer (for example, the layer ID=X) is t=250.

In the case of a shot figure whose total irradiation time "n" is indicated, for example, by a gray level value of 4001, the irradiation time "t" for a shot of repeat ID being ID=2, 3, or 4 in a specific layer (for example, the layer ID=X) is t=250.

In the case of a shot figure whose total irradiation time "n" is indicated, for example, by a gray level value of 4008, the irradiation time "t" for a shot of repeat ID being ID=2, 3, or 4 in a specific layer (for example, the layer ID=X) is t=250.

In the case of a shot figure whose total irradiation time "n" is indicated, for example, by a gray level value of 4009, the irradiation time "t" for a shot of repeat ID being ID=2, 3, or 4 in a specific layer (for example, the layer ID=X) is t=250.

In step S150, as a determination step, the determination unit 232 determines whether, in a specific layer, the remainder (a % r) of dividing the sum total irradiation time "a" by the repeating times number "r" is less than or equal to ½ of the repeating times number "r" or not.

In the case of FIG. 15 as described above, as to the shot figure whose total irradiation time "n" is indicated, for example, by a gray level value of 3999 or 4007, since the remainder (a % r) of dividing the sum total irradiation time "a" by the repeating times number "r" in the specific layer is 3, it does not correspond to being less than or equal to ½ of the repeating times number "r". (In the example of FIG. 15, since r=4, determination is performed whether the remainder is less than or equal to 2.)

In FIG. 15, in the case of the shot figure whose total irradiation time "n" is indicated, for example, by a gray level value of 4000, 4001, 4008, or 4009, since the remainder (a % r) of dividing the sum total irradiation time "a" by the repeating times number "r" in the specific layer is respectively 0, 1, 0, and 1, it corresponds to being less than or equal to ½ of the repeating times number "r". (In the example of FIG. 15, since r=4, determination is performed whether the remainder is less than or equal to 2.)

In step S152, as a determination step, when the remainder (a % r) is less than or equal to ½ of the repeating times number "r", the determination unit 233 determines whether the repeat ID in the specific layer is 1 (the first shot) or not.

In step S153, as a copy processing step, when the remainder (a % r) is less than or equal to ½ of the repeating times number "r" and the repeat ID in the specific layer is 1 (the first shot), the copy processing unit 234 copies (duplicates) shot data for the first shot in the specific layer (for example, the layer ID=1).

In step S154, as an irradiation time calculation step in a specific layer, when the remainder (a % r) is less than or equal to ½ of the repeating times number "r" and the repeat ID in the specific layer is 1 (the first shot), with respect to a specific layer in a plurality of layers, the calculation unit 235 (an example of a second shot irradiation time calculation unit) calculates an integer value (int(a/r)) (a decimal fraction is rounded off when it is not divisible) by dividing the sum total irradiation time "a" by the repeating times number "r", and adds the remainder (a % r) of dividing the sum total irradiation time "a" by the repeating times number "r" to the integer value, and treats the value(t=t+(a % r)) obtained by the addition, as the irradiation time "t" for the first shot of electron beams of a plurality of times of shooting the same position when the remainder (a % r) of dividing the sum total irradiation time "a" by the repeating times number "r" is less than or equal to ½ of the repeating times number "r".

Therefore, in the case of the shot figure whose total irradiation time "n" is indicated, for example, by a gray level value of 4000, the irradiation time "t" of a shot of repeat ID being ID=1 in a specific layer (for example, the layer ID=X) is t=250+0=250.

In the case of the shot figure whose total irradiation time "n" is indicated, for example, by a gray level value of 4001, the irradiation time "t" of a shot of repeat ID being ID=1 in a specific layer (for example, the layer ID=X) is t=250+1=251.

In the case of the shot figure whose total irradiation time "n" is indicated, for example, by a gray level value of 4008, the irradiation time "t" of a shot of repeat ID being ID=1 in a specific layer (for example, the layer ID=X) is t=250+0=250.

In the case of the shot figure whose total irradiation time "n" is indicated, for example, by a gray level value of 4009, the irradiation time "t" of a shot of repeat ID being ID=1 in a specific layer (for example, the layer ID=X) is t=250+1=251.

In step S156, as a determination step, when the remainder (a % r) is not less than or equal to ½ of the repeating times number "r", the determination unit 241 determines whether the repeat ID in a specific layer is 1 (the first shot) or not.

In step S157, as a copy processing step, when the remainder (a % r) is not less than or equal to ½ of the repeating times number "r" and the repeat ID in a specific layer is 1 (the first shot), the copy processing unit 242 copies (duplicates) shot data for the first shot in the specific layer (for example, the layer ID=1).

In step S158, as an irradiation time calculation step in a specific layer, when the remainder (a % r) is not less than or equal to ½ of the repeating times number "r" and the repeat ID in the specific layer is 1 (the first shot), with respect to the specific layer in a plurality of layers, the calculation unit 243 (an example of a third shot irradiation time calculation unit) calculates an integer value (int(a/r)) (a decimal fraction is rounded off when it is not divisible) by dividing the sum total irradiation time "a" by the repeating times number "r", adds 1 to the integer value so as to obtain an added value, subtracts the remainder (a % r) of dividing the sum total irradiation time "a" by the repeating times number "r" from the repeating times number "r" so as to obtain a subtracted value, subtracts this subtracted value (r−(a % r)) from the added value to calculate a value t=t+1−(r−(a % r)), and treats the value t=t+1=(r−(a % r)) as the irradiation time "t" for the first shot of electron beams of a plurality of times of shooting the same position when the remainder (a % r) of dividing the sum total irradiation time "a" by the repeating times number "r" is greater than ½ of the repeating times number "r".

Therefore, in the case of the shot figure whose total irradiation time "n" is indicated, for example, by a gray level value of 3999, the irradiation time "t" of a shot of repeat ID being ID=1 in a specific layer (for example, the layer ID=X) is t=249+1−(4−3)=249.

In the case of the shot figure whose total irradiation time "n" is indicated, for example, by a gray level value of 4007, the irradiation time "t" of a shot of repeat ID being ID=1 in a specific layer (for example, the layer ID=1) is t=250+1−(4−3)=250.

In step S159, as an irradiation time calculation step in a specific layer, when the remainder (a % r) is not less than or equal to ½ of the repeating times number "r" and the repeat ID in a specific layer is not 1 (the first shot), with respect to the specific layer in a plurality of layers, the calculation unit 244 (an example of a fourth shot irradiation time calculation unit) calculates an integer value (int(a/r)) (a decimal fraction is rounded off when it is not divisible) by dividing the sum total irradiation time "a" by the repeating times number "r", adds 1 to the integer value, so as to obtain a value (t=t+1), and treats the value(t=t+1) as the irradiation time "t" for the second and subsequent shots of electron beams of a plurality of times of shooting the same position when the remainder (a % r) of dividing the sum total irradiation time "a" by the repeating times number "r" is greater than ½ of the repeating times number "r".

Therefore, in the case of the shot figure whose total irradiation time "n" is indicated, for example, by a gray level value of 3999, the irradiation time "t" of a shot of repeat ID being ID=2, 3, or 4 in a specific layer (for example, the layer ID=X) is t=249+1=250.

In the case of the shot figure whose total irradiation time "n" is indicated, for example, by a gray level value of 4007, the irradiation time "t" of a shot of repeat ID being ID=2, 3, or 4 in a specific layer (for example, the layer ID=X) is t−250+1=251.

In step S160, as an irradiation time setting step, the setting unit 250 sets (defines) the obtained irradiation time "t" to the shot data which was copied for the first shot in a specific layer.

In step S162, as an irradiation time setting step, the setting unit 252 sets (defines) the obtained irradiation time "t" to the shot data generated originally, for the second and subsequent shots (repeat ID=2, 3, or 4) in a specific layer.

Although, in the example of FIG. 14, shot data generated originally is used as the shot data for the second and subsequent shots (repeat ID=2, 3, or 4) in a specific layer and copied shot data is used for the first shot in the specific layer, it may be vice versa.

In step S164, as a copy processing step, the copy processing unit 256 copies (duplicates) shot data, in which the irradiation time "t" was defined in the irradiation time setting step (S162), the number of copying times equivalent to the number of shots of the second and subsequent time (repeat ID=2, 3, or 4) in a specific layer. In the second and subsequent shots (repeat ID=2, 3, or 4) in the specific layer, since the irradiation time "t" of each shot is the same with each other, the shot data in which the irradiation time "t" has been set can be copied and used as it is. Therefore, in the second and subsequent shots (repeat ID=2, 3, or 4) in the specific layer, it is sufficient to generate only one shot data, and it is unnecessary to generate other shot data. Thus, the processing time can be reduced.

In step S166, as a determination step, the determination unit 254 determines whether calculation and setting of the irradiation time "t" for each of all the repeating times in a specific layer (for example, the layer ID=X) have been completed or not. When not completed, it returns to the determination step (S150) and repeats the steps from the determination step (S150) to the determination step (S166) until completed.

In the irradiation time calculation step (S208) in a non-specific layer, the calculation unit 42 serves as an example of a fifth shot irradiation time calculation unit.

By the configuration as described above, according to the third embodiment, it is possible to suppress the difference of irradiation time between shots to be at most ±(repeating times number "r"/2) gray level as shown in FIG. 15. Although this gray level difference is wider than that of the first embodiment in which the difference is at most 1 gray level, it is possible to greatly reduce the gray level difference compared with that of the comparative example (tshot) in which the difference is at most (multiplicity (mr)−1) gray level. Furthermore, it is possible to suppress the gray level difference to be smaller than that of the second embodiment in which the difference is at most (repeating times number "r"−1) gray level. The maximum difference±(repeating times number "r"/2) gray level is sufficiently within the tolerance level.

Moreover, in the third embodiment, since the fraction of the irradiation time is included only in the first shot of a specific layer, it is sufficient in other non-specific layers to copy the shot data, in which the irradiation time has already been defined, the number of copying times equivalent to the repeating times. Furthermore, in the second and subsequent shots in the specific layer, it is sufficient to respectively copy the shot data, in which the irradiation time has already been defined, the number of copying times equivalent to the repeating times of the second and subsequent shots. Therefore, according to the third embodiment, the data processing time can be shorter than that of the first embodiment, needless to say shorter than that of the comparative example (ishot). Moreover, since the third embodiment is the same as the comparative example (tshot) in that the fraction of the irradiation time is included only in the first shot in a specific layer, the data processing time can be reduced similarly to the comparative example (tshot).

Embodiments have been explained referring to concrete examples described above. However, the present invention is not limited to these specific examples.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus, writing method, and apportionment method of irradiation time of charged particle beams for multiple writing that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a sum total irradiation time calculation unit configured
to obtain a specific value by calculating an integer value by dividing a total irradiation time "n" of charged particle beams of a plurality of times of shooting a same position by a multiplied value, which is obtained by multiplying a multiple writing unit region number "m" being a number of a plurality of multiple writing unit regions for performing multiple writing while shifting a position by a repeating times number "r" being a number of repeating times of performing multiple writing without shifting a position in each of the plurality of multiple writing unit regions, and by multiplying the integer value by the repeating times number "r",
to add the repeating times number "r" to the specific value in a first case that a multiple writing unit region is in the plurality of multiple writing unit regions and is not a specific multiple writing unit region previously set in the plurality of multiple writing unit regions and a multiple writing unit region number of the multiple writing unit region, defined excluding the specific multiple writing unit region, is less than or equal to a value that is obtained by dividing the total irradiation time "n" by the multiplied value, which is calculated by multiplying the multiple writing unit region number "m" by the repeating times number "r", so as to obtain a first remainder, and further dividing the first remainder by the repeating times number "r", and to treat an added value of "r" and the specific value, as a sum total irradiation time "a" of a charged particle beam in the multiple writing unit region, in the charged particle beams of the plurality of times of shooting the same position,
to treat the specific value as the sum total irradiation time of the charged particle beam in the multiple writing unit region, in the charged particle beams of the plurality of times of shooting the same position, in a second case that the multiple writing unit region is in the plurality of multiple writing unit regions and is not the specific multiple writing unit region previously set in the plurality of multiple writing unit regions and the multiple writing unit region number of the multiple writing unit region, defined excluding the specific multiple writing unit region, is not less than or equal to the value that is obtained by dividing the first remainder by the repeating times number "r", and
to add a second remainder to the specific value in a third case that the multiple writing unit region is the specific multiple writing unit region previously set in the plurality of multiple writing unit regions, where the second remainder is obtained by dividing the total irradiation time "n" by the repeating times number "r", and to treat an added value of the second remainder and the specific value, as the sum total irradiation time of the charged particle beam in the multiple writing unit region, in the charged particle beams of the plurality of times of shooting the same position; and
a writing unit configured to write a pattern on a target object by irradiating the target object with the charged particle beams to be the sum total irradiation time in one case of the first, the second, and the third cases corresponding to each of the plurality of multiple writing unit regions.

2. The apparatus according to claim 1,
wherein the sum total irradiation time calculation unit includes a reference sum total irradiation time calculation unit configured to calculate a value by obtaining the integer value by dividing the total irradiation time "n" by the multiplied value obtained by multiplying the multiple writing unit region number "m" by the repeating times number "r", and by multiplying the integer value by the repeating times number "r", and treats the value calculated, as a reference sum total irradiation time.

3. The apparatus according to claim 2,
wherein the sum total irradiation time calculation unit further includes a first determination unit configured to determine whether a multiple writing unit region for which the sum total irradiation time is to be calculated is the specific multiple writing unit region.

4. The apparatus according to claim 3,
wherein the sum total irradiation time calculation unit further includes a specific region sum total irradiation time calculation unit configured to calculate a value by adding the second remainder of dividing the total irradiation time "n" by the repeating times number "r" to the reference sum total irradiation time.

5. The apparatus according to claim 3,
wherein the sum total irradiation time calculation unit further includes a threshold value calculation unit configured to obtain an integer value, as a threshold value, by dividing the total irradiation time "n" by the multiplied value obtained by multiplying the multiple writing unit region number "m" by the repeating times number "r" so as to obtain the first remainder and further dividing the first remainder by the repeating times number "r".

6. The apparatus according to claim 5,
wherein the sum total irradiation time calculation unit further includes a second determination unit configured to determine, in a case that the multiple writing unit region is in the plurality of multiple writing unit regions and is not the specific multiple writing unit region previously set in the plurality of multiple writing unit regions, whether the multiple writing unit region number, defined excluding the specific multiple writing unit region, is less than or equal to the threshold value.

7. The apparatus according to claim 6,
wherein the sum total irradiation time calculation unit further includes a non-specific region sum total irradiation time calculation unit configured to calculate a value by adding the repeating times number "r" to the reference sum total irradiation time.

8. The apparatus according to claim 1, further comprising:
a storage unit configured to store pattern data that defines a figure pattern; and
a shot data generation unit configured to read the pattern data from the storage unit, and generate shot data of a plurality of shot figures made by dividing the figure pattern into the plurality of shot figures each having a size to be shaped by one beam shot,
wherein the shot data generation unit generates shot data of the plurality of shot figures that have been divided again for each of the plurality of multiple writing unit regions where multiple writing is performed while shifting a position.

9. The apparatus according to claim 1, further comprising:
a first shot irradiation time calculation unit configured to calculate, with respect to the specific multiple writing unit region in the plurality of multiple writing unit regions, an integer value by dividing the sum total irradiation time "a" by the repeating times number "r", and to treat the integer value as the irradiation time "t" for a second and subsequent shots of the charged particle beams of the plurality of times of shooting the same position;
a second shot irradiation time calculation unit configured to calculate, with respect to the specific multiple writing unit region in the plurality of multiple writing unit regions, a value by adding a remainder of dividing the sum total irradiation time "a" by the repeating times number "r" to the integer value obtained by dividing the sum total irradiation time "a" by the repeating times number "r", and to treat the value as the irradiation time "t" for a first shot of the charged particle beams of the plurality of times of shooting the same position; and
a third shot irradiation time calculation unit configured to calculate, with respect to multiple writing unit regions other than the specific multiple writing unit region in the plurality of multiple writing unit regions, the integer value by dividing the sum total irradiation time "a" by the repeating times number "r", and to treat the integer value as the irradiation time "t" for an each time shot of the charged particle beams of the plurality of times of shooting the same position.

10. The apparatus according to claim 1, further comprising:
a first shot irradiation time calculation unit configured to calculate, with respect to the specific multiple writing unit region in the plurality of multiple writing unit regions, an integer value by dividing the sum total irradiation time "a" by the repeating times number "r", and when a remainder of dividing the sum total irradiation time "a" by the repeating times number "r" is less than or equal to ½ of the repeating times number "r", to treat the integer value as the irradiation time "t" for a second and subsequent shots of the charged particle beams of the plurality of times of shooting the same position;
a second shot irradiation time calculation unit configured to calculate, with respect to the specific multiple writing unit region in the plurality of multiple writing unit regions, a value by adding the remainder of dividing the sum total irradiation time "a" by the repeating times number "r" to the integer value obtained by dividing the sum total irradiation time "a" by the repeating times number "r", and when the remainder of dividing the sum total irradiation time "a" by the repeating times number "r" is less than or equal to ½ of the repeating times number "r", to treat the value as the irradiation time "t" for a first shot of the charged particle beams of the plurality of times of shooting the same position;
a third shot irradiation time calculation unit configured to calculate, with respect to the specific multiple writing unit region in the plurality of multiple writing unit regions, a first value by adding 1 to the integer value obtained by dividing the sum total irradiation time "a" by the repeating times number "r", a second value by subtracting the remainder of dividing the sum total irradiation time "a" by the repeating times number "r" from the repeating times number "r", and a third value by subtracting the second value from the first value, and when the remainder of dividing the sum total irradiation time "a" by the repeating times number "r" is greater than ½ of the repeating times number "r", to treat the third value as the irradiation time "t" for the first shot of the charged particle beams of the plurality of times of shooting the same position;
a fourth shot irradiation time calculation unit configured to calculate, with respect to the specific multiple writing unit region in the plurality of multiple writing unit regions, a value by adding 1 to the integer value obtained by dividing the sum total irradiation time "a" by the repeating times number "r", and when the remainder of dividing the sum total irradiation time "a" by the repeating times number "r" is greater than ½ of the repeating times number "r", to treat the value as the irradiation time "t" for the second and subsequent shots of the charged particle beams of the plurality of times of shooting the same position; and
a fifth shot irradiation time calculation unit configured to calculate, with respect to multiple writing unit regions other than the specific multiple writing unit region in the plurality of multiple writing unit regions, the integer value by dividing the sum total irradiation time "a" by the repeating times number "r", and to treat the integer value as the irradiation time "t" for an each time shot of the charged particle beams of the plurality of times of shooting the same position.

11. The apparatus according to claim 1, further comprising:
a first shot irradiation time calculation unit configured to calculate, with respect to the specific multiple writing unit region in the plurality of multiple writing unit regions, an integer value by dividing the sum total irradiation time "a" by the repeating times number "r", and to treat the integer value as the irradiation time "t" for a shot with respect to which a remainder of dividing the sum total irradiation time "a" by the repeating times number "r" is not greater than or equal to a number of a certain number-th writing of multiple writing whose repeating times number is "r";

a second shot irradiation time calculation unit configured to calculate, with respect to the specific multiple writing unit region in the plurality of multiple writing unit regions, a value by adding 1 to the integer value obtained by dividing the sum total irradiation time "a" by the repeating times number "r", and to treat the value as the irradiation time "t" for a shot with respect to which the remainder of dividing the sum total irradiation time "a" by the repeating times number "r" is greater than or equal to a number of a certain number-th writing of multiple writing whose repeating times number is "r"; and a third shot irradiation time calculation unit configured to calculate, with respect to multiple writing unit regions other than the specific multiple writing unit region in the plurality of multiple writing unit regions, the integer value by dividing the sum total irradiation time "a" by the repeating times number "r", and to treat the integer value as the irradiation time "t" for an each time shot in the multiple writing unit regions other than the specific multiple writing unit region in the plurality of multiple writing unit regions.

12. An irradiation time apportionment method of charged particle beams for multiple writing comprising:

calculating, with a hardware being different from a computer, a computer or a combination of a hardware and a computer, a first value, which is to be output, by obtaining an integer value by dividing a total irradiation time "n" by a multiplied value, which is obtained by multiplying a multiple writing unit region number "m" by a repeating times number "r", by multiplying the integer value by the repeating times number "r", and by adding the repeating times number "r" to a multiplied integer value, and treating the value as a sum total irradiation time "a" of a charged particle beam in a multiple writing unit region concerned, in charged particle beams of a plurality of times of shooting a same position, in a first case that the multiple writing unit region concerned is in a plurality of multiple writing unit regions for performing multiple writing while shifting a position and is not a specific multiple writing unit region previously set in the plurality of multiple writing unit regions, and a multiple writing unit region number of the multiple writing unit region concerned, defined excluding the specific multiple writing unit region, is less than or equal to a value that is obtained by dividing the total irradiation time "n" of the charged particle beams of the plurality of times of shooting the same position by the multiplied value, which is calculated by multiplying the multiple writing unit region number "m" being a number of a plurality of multiple writing unit regions by a repeating times number "r" being a number of repeating times of performing multiple writing without shifting a position in each of the plurality of multiple writing unit regions, so as to obtain a first remainder, and further dividing the first remainder by the repeating times number "r";

calculating, with a hardware being different from a computer, the computer or a combination of a hardware and the computer, a second value, which is to be output, by obtaining the integer value by dividing the total irradiation time "n" by the multiplied value, which is obtained by multiplying the multiple writing unit region number "m" by the repeating times number "r", and by multiplying the integer value by the repeating times number "r", and treating the value as the sum total irradiation time of the charged particle beam in the multiple writing unit region concerned, in the charged particle beams of the plurality of times of shooting the same position, in a second case that the multiple writing unit region concerned is in the plurality of multiple writing unit regions and is not the specific multiple writing unit region previously set in the plurality of multiple writing unit regions, and the multiple writing unit region number of the multiple writing unit region concerned, defined excluding the specific multiple writing unit region, is not less than or equal to a value obtained by dividing the first remainder by the repeating times number "r";

calculating, with a hardware being different from a computer, the computer or a combination of a hardware and the computer, a third value, which is to be output, by obtaining the integer value by dividing the total irradiation time "n" by the multiplied value, which is obtained by multiplying the multiple writing unit region number "m" by the repeating times number "r", by multiplying the integer value by the repeating times number "r", and by adding a second remainder of dividing the total irradiation time "n" by the repeating times number "r" to a multiplied integer value, and treating the value as the sum total irradiation time of the charged particle beam in the multiple writing unit region concerned, in the charged particle beams of the plurality of times of shooting the same position in a third case that the multiple writing unit region concerned is the specific multiple writing unit region previously set in the plurality of multiple writing unit regions; and setting an irradiation time of a charged particle beam obtained by using one of the first value, the second value and the third value to a charged particle beam writing apparatus.

13. The method according to claim 12,
wherein the calculating the sum total irradiation time includes calculating a value by obtaining the integer value by dividing the total irradiation time "n" by the multiplied value obtained by multiplying the multiple writing unit region number "m" by the repeating times number "r", and by multiplying the integer value by the repeating times number "r", and treating the value calculated, as a reference sum total irradiation time.

14. The method according to claim 13,
wherein the calculating the sum total irradiation time includes determining whether a multiple writing unit region for which the sum total irradiation time is to be calculated is the specific multiple writing unit region.

15. The method according to claim 14,
wherein the calculating the sum total irradiation time includes calculating a value by adding the second remainder of dividing the total irradiation time "n" by the repeating times number "r" to the reference sum total irradiation time.

16. The method according to claim 14,
wherein the calculating the sum total irradiation time includes calculating an integer value, as a threshold value, by dividing the total irradiation time "n" by the multiplied value obtained by multiplying the multiple writing unit region number "m" by the repeating times number "r" so as to obtain the first remainder and further dividing the first remainder by the repeating times number "r".

17. The method according to claim 16,
wherein the calculating the sum total irradiation time includes determining, when the multiple writing unit region is in the plurality of multiple writing unit regions and is not the specific multiple writing unit region previously set in the plurality of multiple writing unit regions, whether the multiple writing unit region number, defined excluding the specific multiple writing unit region, is less than or equal to the threshold value.

18. The method according to claim 12, further comprising:
calculating, with a hardware being different from a computer, the computer or a combination of a hardware and the computer, with respect to the specific multiple writing unit region in the plurality of multiple writing unit regions, an integer value by dividing the sum total irradiation time "a" by the repeating times number "r", and treating the integer value as the irradiation time "t" for a second and subsequent shots of the charged particle beams of the plurality of times of shooting the same position;
calculating, with a hardware being different from a computer, a computer or a combination of a hardware and a computer, with respect to the specific multiple writing unit region in the plurality of multiple writing unit regions, a value by adding a remainder of dividing the sum total irradiation time "a" by the repeating times number "r" to the integer value obtained by dividing the sum total irradiation time "a" by the repeating times number "r", and treating the value as the irradiation time "t" for a first shot of the charged particle beams of the plurality of times of shooting the same position; and
calculating, with a hardware being different from a computer, the computer or a combination of a hardware and the computer, with respect to multiple writing unit regions other than the specific multiple writing unit region in the plurality of multiple writing unit regions, the integer value by dividing the sum total irradiation time "a" by the repeating times number "r", and treating the integer value as the irradiation time "t" for an each time shot of the charged particle beams of the plurality of times of shooting the same position.

19. The method according to claim 12, further comprising:
calculating, with a hardware being different from a computer, the computer or a combination of a hardware and the computer, with respect to the specific multiple writing unit region in the plurality of multiple writing unit regions, an integer value by dividing the sum total irradiation time "a" by the repeating times number "r", and when a remainder of dividing the sum total irradiation time "a" by the repeating times number "r" is less than or equal to ½ of the repeating times number "r", treating the integer value as the irradiation time "t" for a second and subsequent shots of the charged particle beams of the plurality of times of shooting the same position;
calculating, with a hardware being different from a computer, the computer or a combination of a hardware and the computer, with respect to the specific multiple writing unit region in the plurality of multiple writing unit regions, a value by adding the remainder of dividing the sum total irradiation time "a" by the repeating times number "r" to the integer value obtained by dividing the sum total irradiation time "a" by the repeating times number "r", and when the remainder of dividing the sum total irradiation time "a" by the repeating times number "r" is less than or equal to ½ of the repeating times number "r", treating the value as the irradiation time "t" for a first shot of the charged particle beams of the plurality of times of shooting the same position;
calculating, with a hardware being different from a computer, the computer or a combination of a hardware and the computer, with respect to the specific multiple writing unit region in the plurality of multiple writing unit regions, a first value by adding 1 to the integer value obtained by dividing the sum total irradiation time "a" by the repeating times number "r", a second value by subtracting the remainder of dividing the sum total irradiation time "a" by the repeating times number "r" from the repeating times number "r", and a third value by subtracting the second value from the first value, and when the remainder of dividing the sum total irradiation time "a" by the repeating times number "r" is greater than ½ of the repeating times number "r", treating the third value as the irradiation time "t" for the first shot of the charged particle beams of the plurality of times of shooting the same position;
calculating, with a hardware being different from a computer, the computer or a combination of a hardware and the computer, with respect to the specific multiple writing unit region in the plurality of multiple writing unit regions, a value by adding 1 to the integer value obtained by dividing the sum total irradiation time "a" by the repeating times number "r", and when the remainder of dividing the sum total irradiation time "a" by the repeating times number "r" is greater than ½ of the repeating times number "r", treating the value as the irradiation time "t" for the second and subsequent shots of the charged particle beams of the plurality of times of shooting the same position; and
calculating, with a hardware being different from a computer, the computer or a combination of a hardware and the computer, with respect to multiple writing unit regions other than the specific multiple writing unit region in the plurality of multiple writing unit regions, the integer value by dividing the sum total irradiation time "a" by the repeating times number "r", and treating the integer value as the irradiation time "t" for an each time shot of the charged particle beams of the plurality of times of shooting the same position.

20. The method according to claim 12, further comprising:
calculating, with a hardware being different from a computer, the computer or a combination of a hardware and the computer, with respect to the specific multiple writing unit region in the plurality of multiple writing unit regions, an integer value by dividing the sum total irradiation time "a" by the repeating times number "r", and treating the integer value as the irradiation time "t" for a shot with respect to which a remainder of dividing the sum total irradiation time "a" by the repeating times number "r" is not greater than or equal to a number of a certain number-th writing of multiple writing whose repeating times number is "r";
calculating, with a hardware being different from a computer, the computer or a combination of a hardware and the computer, with respect to the specific multiple writing unit region in the plurality of multiple writing unit regions, a value by adding 1 to the integer value obtained by dividing the sum total irradiation time "a" by the repeating times number "r", and treating the value as the irradiation time "t" for a shot with respect to which remainder of dividing the sum total irradiation time "a" by the repeating times number "r" is greater than or equal to a number of a certain number-th writing of multiple writing whose repeating times number is "r"; and calculating, with a hardware being different from a computer, the computer or a combination of a hardware and the computer, with respect to multiple writing unit regions other than the specific multiple writing unit region in the plurality of multiple writing unit regions, the integer value by dividing the sum total irradiation time "a" by the repeating times number "r", and treating the integer value as the irradiation time "t" for an each time shot in the multiple writing unit regions other than the specific multiple writing unit region in the plurality of multiple writing unit regions.

* * * * *